United States Patent
Elton

(10) Patent No.: US 7,609,895 B2
(45) Date of Patent: Oct. 27, 2009

(54) METHODS AND APPARATUS FOR PERFORMING MQ-DECODING OPERATIONS

(75) Inventor: John H. Elton, Atlanta, GA (US)

(73) Assignee: Pegasus Imaging Corporation, Tampa, FL (US)

( * ) Notice: Subject to any disclaimer, the term of this patent is extended or adjusted under 35 U.S.C. 154(b) by 689 days.

(21) Appl. No.: 10/990,326

(22) Filed: Nov. 16, 2004

(65) Prior Publication Data

US 2006/0104522 A1    May 18, 2006

(51) Int. Cl.
 G06K 9/36    (2006.01)
 G06F 7/52    (2006.01)
 G06K 9/46    (2006.01)
(52) U.S. Cl. .................. 382/232; 382/240; 708/503
(58) Field of Classification Search ............. 382/232, 382/233, 234, 240, 247, 250, 251, 254, 276, 382/277, 305; 375/240.03, 240.1, 240.19, 375/240.25; 341/51, 106, 107; 708/205, 708/503
See application file for complete search history.

(56) References Cited

U.S. PATENT DOCUMENTS

| 4,334,284 | A | * | 6/1982 | Wong | 708/503 |
| 6,765,515 | B2 | * | 7/2004 | Miyamoto | 341/107 |
| 7,006,697 | B1 | * | 2/2006 | Gormish et al. | 382/234 |
| 7,352,903 | B2 | * | 4/2008 | Withers et al. | 382/232 |
| 2006/0039613 | A1 | * | 2/2006 | Withers et al. | 382/232 |
| 2006/0104522 | A1 | * | 5/2006 | Elton | 382/232 |

* cited by examiner

Primary Examiner—Amir Alavi
(74) Attorney, Agent, or Firm—Straub & Pokotylo; Michael P. Straub; Abbas H. Zaidi

(57) ABSTRACT

Methods and apparatus for providing JPEG decoder functions are described. In particular, features and methods of the present invention are directed to an efficient way of implementing a non-common decoding path function used in an MQ-coder, such as the type used to decode JPEG-2000 images. The methods of the present invention are well suited for implementation on general purpose computers such as conventional personal computers (PCs) and can provide improved decoding speed, compared to known systems which use processing branches as part of a non-common decoding path function by reducing and, in some implementations completely avoiding, branches. Thus, branch prediction penalties associated with known decoding schemes are reduced or avoided leading, in many cases, to faster decoding rates when using a general purpose processor of a given speed or computational capability.

18 Claims, 21 Drawing Sheets

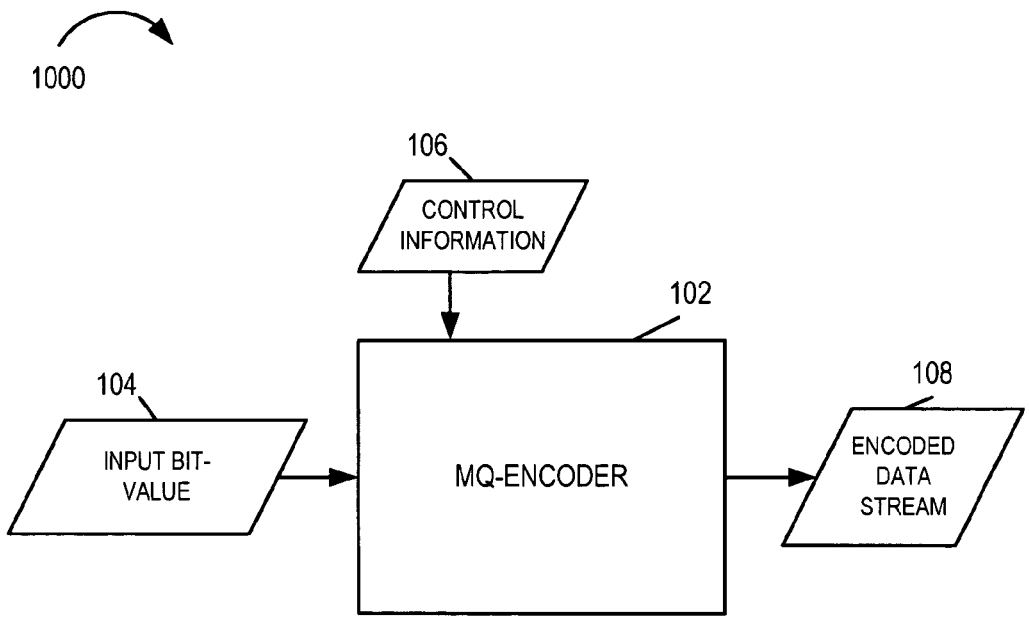
FIGURE 1A ENCODER
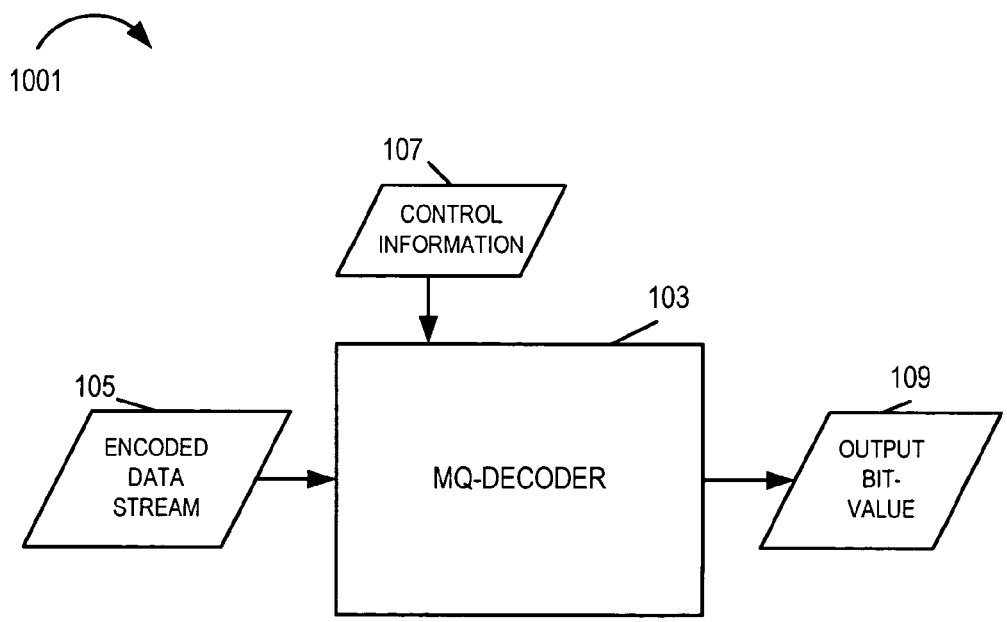
FIGURE 1B DECODER

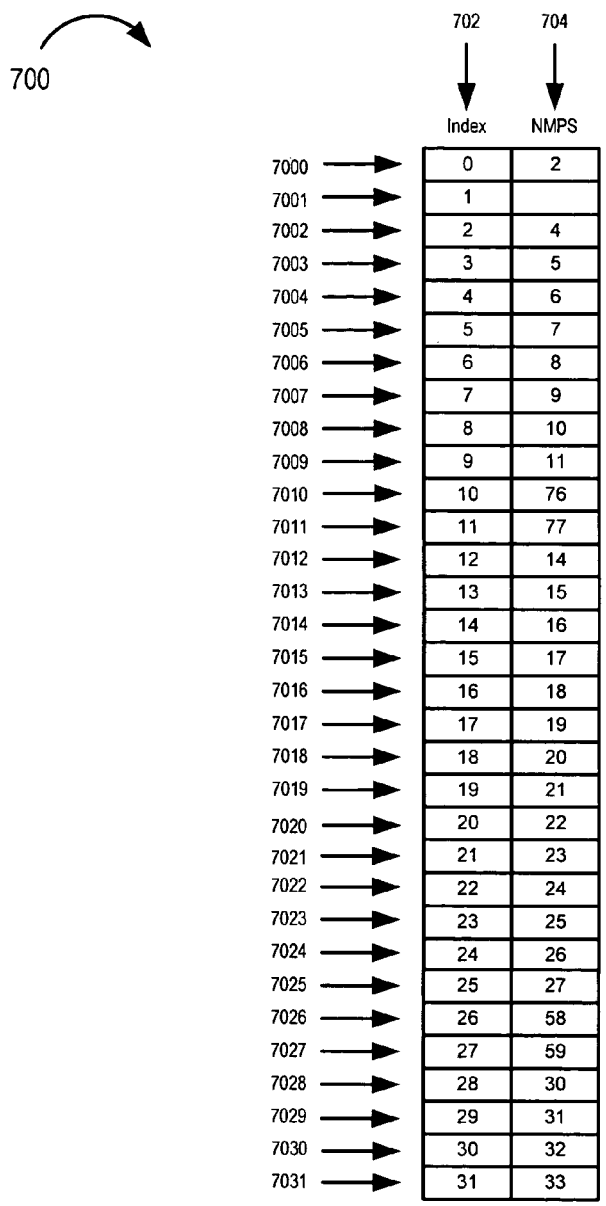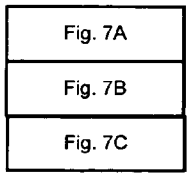
FIGURE 7A

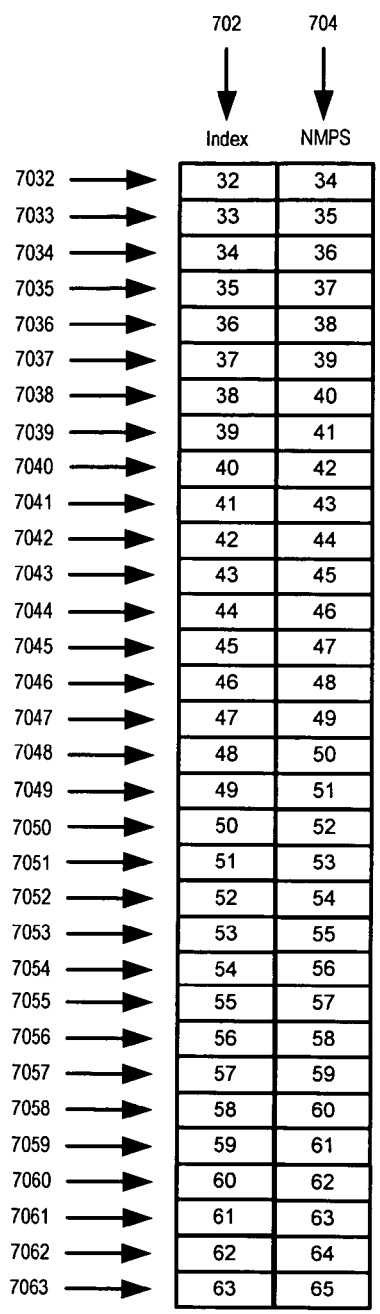
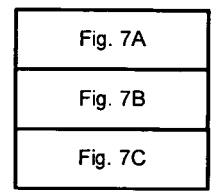
FIGURE 7B

| Index | NMPS |
|---|---|
| 64 | 66 |
| 65 | 67 |
| 66 | 68 |
| 67 | 69 |
| 68 | 70 |
| 69 | 71 |
| 70 | 72 |
| 71 | 73 |
| 72 | 74 |
| 73 | 75 |
| 74 | 76 |
| 75 | 77 |
| 76 | 78 |
| 77 | 79 |
| 78 | 80 |
| 79 | 81 |
| 80 | 82 |
| 81 | 83 |
| 82 | 84 |
| 83 | 85 |
| 84 | 86 |
| 85 | 87 |
| 86 | 88 |
| 87 | 89 |
| 88 | 90 |
| 89 | 91 |
| 90 | 90 |
| 91 | 91 |
| 92 | 92 |

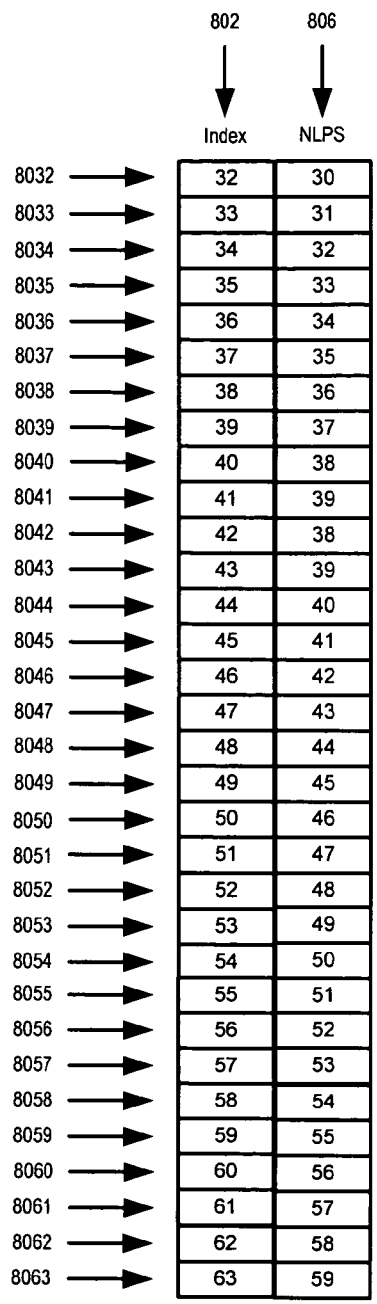
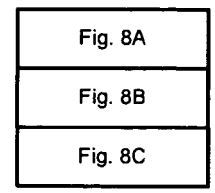
FIGURE 8B 802      806
               ↓        ↓
              Index    NLPS

| Index | NLPS |
|-------|------|
| 8064 → 64 | 60 |
| 8065 → 65 | 61 |
| 8066 → 66 | 62 |
| 8067 → 67 | 63 |
| 8068 → 68 | 64 |
| 8069 → 69 | 65 |
| 8070 → 70 | 66 |
| 8071 → 71 | 67 |
| 8072 → 72 | 68 |
| 8073 → 73 | 69 |
| 8074 → 74 | 70 |
| 8075 → 75 | 71 |
| 8076 → 76 | 72 |
| 8077 → 77 | 73 |
| 8078 → 78 | 74 |
| 8079 → 79 | 75 |
| 8080 → 80 | 76 |
| 8081 → 81 | 77 |
| 8082 → 82 | 78 |
| 8083 → 83 | 79 |
| 8084 → 84 | 80 |
| 8085 → 85 | 81 |
| 8086 → 86 | 82 |
| 8087 → 87 | 83 |
| 8088 → 88 | 84 |
| 8089 → 89 | 85 |
| 8090 → 90 | 86 |
| 8091 → 91 | 87 |
| 8092 → 92 | 92 |

| Fig. 8A |
|---------|
| Fig. 8B |
| Fig. 8C |

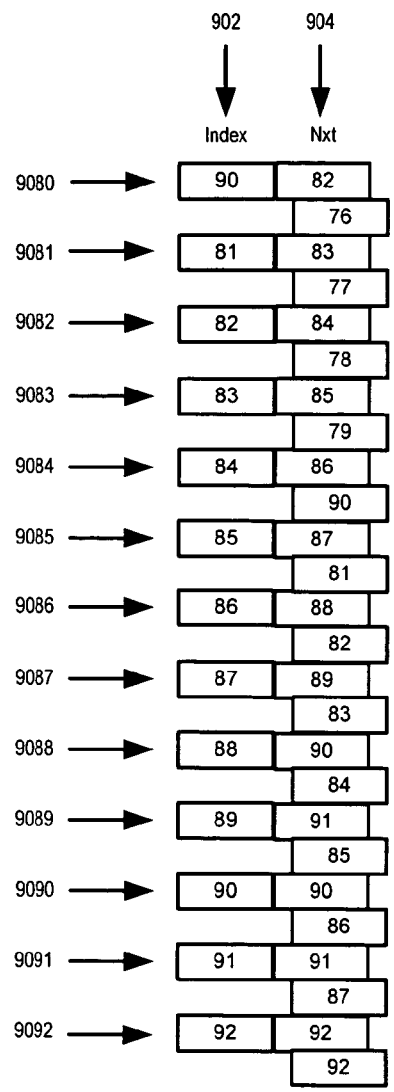
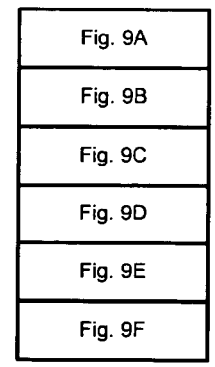
FIGURE 9F

METHODS AND APPARATUS FOR PERFORMING MQ-DECODING OPERATIONS

FIELD OF THE INVENTION

The present invention relates to data compression and, more particularly, to methods and apparatus for performing MQ-decoding operations, e.g., JPEG 2000 and/or JBIG-2 MQ-decoder operations.

BACKGROUND

Overview of the MQ-Coders and Decoders

Entropy coding is a core concept in many processes or devices for the compact representation of digital data. In the context of coding bit-values (0 or 1), entropy coding exploits any imbalance in the frequency of occurrence of bit-values (more 0's than 1's or vice-versa) to code the sequence of bit-values more compactly. For each bit-value coded or decoded, the entropy-coding component is supplied with a predicted bit value (termed MPS "more probable symbol", the opposite bit value being termed LPS "less probable symbol") together with a probability value P representing the level of confidence that the prediction is correct. When the prediction is correct, the bit-value is coded more compactly—the more confident the original prediction, the more compact the resulting coding. Conversely, when the prediction is incorrect, the bit-value must be coded using more than one bit—and the more confident the original prediction, the greater the penalty for an incorrect guess. However, the trade-off is such that the more confident the prediction, the more compact the overall coding is, even taking into account the penalty for mistaken predictions.

Let P be a value between 0.5 and 1 indicating the confidence of a given bit-value prediction. Values of P less than 0.5 do not occur because such would indicate that the opposite bit-value is more likely to occur. A value of P equaling 1 indicates perfect confidence—a predicted value that is guaranteed to be correct. The number of bits required to code the bit-value in the event the prediction is correct is given by (lg P) (base 0.5 logarithm of P). The number of bits required to code the bit-value in the event the prediction is incorrect is given by (lg(1−P)). Taking probabilities of both correct and incorrect prediction into account, the overall expected number of bits required to code the bit-value is H=(P lg P+(1−P) lg(1−P) ). Table 1 shown below shows the bits required to code correct and incorrect predictions, and the overall expected number of bits required, for various sample values of P.

TABLE 1

| P | lg P | lg(1 − P) | H |
|---|------|-----------|---|
| 0.5 | 1.0000 | 1.0000 | 1.0000 |
| 0.6 | 0.8656 | 1.3219 | 0.9710 |
| 0.7 | 0.5146 | 1.7370 | 0.8813 |
| 0.8 | 0.3219 | 2.3219 | 0.7219 |
| 0.9 | 0.1520 | 3.3219 | 0.4690 |
| 1.0 | 0.0000 | infinity | 0.0000 |

The compactness of the coding is greatly enhanced by grouping the bit-values to be encoded or decoded into categories. The bit-values in each category are expected to have similar confidence values of predictability. Each bit-value to be encoded or decoded is assigned to one such category, called the context for that bit-value.

Thus an encoder/decoder pair exploiting such frequency imbalances for compact coding of data can be represented as in FIGS. 1A and 1B.

FIG. 1A shows an MQ encoder 102. For each input bit-value 104 to be encoded, additional control information 106 is input which directly or indirectly reflects the predicted bit-value and the confidence level P for the bit-value. The output from successive calls to the encoder is the encoded data stream 108 which may be transmitted or stored.

FIG. 1B shows an MQ decoder 103. For each bit-value to be decoded, additional control information 107 is input. In general this information must match exactly the additional control information previously supplied to the encoder 102 when encoding the symbol now to be decoded. Data is imported as needed from the coded data stream 105; in many cases the data needed to decode a given bit-value will have been imported from the coded data stream prior to the actual decoding operation for the bit-value. The decoded bit-value 109 is the output from the decoder 103.

To appreciate the decoding method of the invention, some background on encoding is useful. Accordingly, entropy encoding will now be discussed briefly.

FIG. 11 shows a known high-level procedure for expanding data incorporating an entropy encoder. From start step 1102, execution proceeds to step 1004, which performs any necessary initialization of state variables, look-up tables, etc., for the entropy encoder. Execution then proceeds to step 1006.

In step 1006, the next bit-value S to be encoded is determined, along with the necessary additional control information ("coding context") cx. The details of this step as rule are independent of the operation of the entropy coder and highly dependent on the specific type of data being compressed. Execution then proceeds to step 1008.

In step 1008, the entropy encoder is used to encode the given bit-value S using the additional control information cx. Coded data is output as necessary to the coded data stream 1014. Execution then proceeds to step 1010.

In step 1010 a determination is made as to whether all necessary data has been coded. If not, then execution proceeds to step 1006. Otherwise, execution proceeds to step 1012.

In step 1012, any additional coded data needed to ensure correct decoding of all encoded bit-values is flushed to the coded data stream 1014. Execution then proceeds to the end 1016 of the procedure.

FIG. 10 shows a higher-level procedure for compressing data incorporating an entropy decoder. From start step 1102, execution proceeds to step 1104, which performs any necessary initialization of state variables, look-up tables, etc., for the entropy decoder. This operation may import data from the coded data stream 1114 to determine initial values of the decoding state variables. Execution then proceeds to step 1106.

In step 1106, the control information ("coding context") cx necessary for decoding the next bit-value is determined. The details of this step as rule are independent of the operation of the entropy coder and highly dependent on the specific type of data being compressed. Execution then proceeds to step 1108.

In step 1108, the entropy coder is used to decode the given bit-value S using the additional control information cx. Coded data is imported as necessary from the coded data stream 1114. Execution then proceeds to step 1110.

In step 1110 a determination is made as to whether all necessary data has been coded. If not, then execution proceeds to step 1106. Otherwise, execution proceeds to the end 1116 of the procedure.

The MQ-coder is one of a family of arithmetic entropy-coders. It is used in particular as part of the JPEG 2000 and JBIG 2 image-coding standards ([4], [5]). The arithmetic decoding operation can be summarized as follows. The decoder maintains a code-stream value C which at any decoding step is allowed to range over an interval of values from Cmin to Cmax. At each step a split point Csplit between Cmin and Cmax is determined, dividing the interval from Cmin to Cmax into two generally unequal subintervals. The next decoded bit-value is determined to be 0 or 1 according to which subinterval contains the code-stream value C; that is according to whether C is greater than or less than Csplit. As a rule, the larger subinterval should correspond to the predicted value, and should have a length close to P times the total distance from Cmin to Cmax. The endpoints of whichever subinterval contains the code value C become values of Cmin and Cmax for the next bit-value to be decoded.

The MQ-coder operates according to this general principle, but is designed with the goal of rapid encoding and decoding. In the MQ-coder Cmin is fixed at zero, and Cmax is specified by a variable A. The split point Csplit is determined by setting the length of the lower interval to a value Q (i.e., Csplit=Cmin+Q=Q) depending on the confidence level P but independent of the total interval length A=(Cmax−Cmin). This is an approximation to the ideal value A(1−P), made for the sake of speed. In order for the approximation to be effective, the total interval length A must be maintained between a minimum value Amin and a maximum value Amax=2Amin. With each bit-value decoded, as the interval from Cmin to Cmax is replaced by the chosen subinterval length, the value of A decreases. When the value of A drops below Amin, the values of both A and C are repeatedly doubled (and data from the input buffer used to fill in the lowest-order bit-values of C), a process termed renormalization.

The approximation entailed in determining the length of the lower subinterval as a fixed number Q independent of the total interval length A means that the lower subinterval may exceed the upper subinterval in length, even though the ideal length A(1−P) of the lower subinterval never exceeds the ideal length AP of the subinterval (P never being less than ½). In the MQ-coder the shorter subinterval (which may be the upper or the lower) is always assigned to LPS and the longer subinterval is always assigned to MPS—meaning that the LPS is decoded if the code-stream value C lies in the shorter subinterval and the MPS is decoded if the code-stream value C lies in the longer subinterval.

State variables for the MQ-decoder (those whose values are needed to describe the state of the decoding process from one decoding operation to the next are as shown in Table 1.

TABLE I

| A | total interval length |
|---|---|
| C | code value |

An additional feature of the MQ-coder is integrated estimation of the value of P. For each bit-value to be encoded or decoded, an auxiliary parameter, the context is passed to the coder. This context actually contains five pieces of information: the value Q to be used to locate the split point, the predicted bit-value MPS, and new context values NMPS and NLPS which replace the current context value in the event that the encoded or decoded bit-value is MPS or LPS, respectively. Each context value is associated with a specific value of the confidence level P, but this is not stored as it plays no direct role in the coding operation. In general, the new context value indicated by NMPS keeps the same value of MPS and has a lower value of Q (corresponding to a higher value of P). Thus in response to a successful prediction (indicated by a coded bit-value of MPS) the confidence level is increased for the next prediction. Conversely, the new context value indicated by NLPS usually keeps the same value of MPS and has a higher value of Q (corresponding to a lower value of P). In a few exceptional cases corresponding to values of P just slightly higher than ½, the context value indicated by NLPS reverses the value of MPS. Thus in response to a failed prediction (Indicated by a coded bit-value of LPS) with very low confidence, the opposite bit-value is used for the next prediction.

An exception to the foregoing is that the context value is not altered if no renormalization operation takes place.

Thus in order to decode a single bit-value the following actions, or processing which achieves an equivalent result, needs to be performed:

1) The split point Csplit is calculated by obtaining the value Q corresponding to the given context;
2) The code-value C is compared to Csplit to determine which subinterval is to be chosen;
3) If the upper subinterval is chosen, then Csplit is subtracted from C to maintain the value of Cmin at zero;
4) The value of A is updated to the length of whichever subinterval is chosen;
5) The lengths of the two subintervals are compared to determine which represents MPS and which represents LPS.
6) The new value of A is compared to Amin to determine whether renormalization is required;
7) In the event renormalization is required, the context value is updated to either NMPS or NLPS.

These need not necessarily be performed as 5 separate coding steps, because the comparisons entailed are not mutually independent. For example, since the value of A never exceeds 2*Amin, and since LPS always corresponds to the shorter of two subintervals, renormalization is always required in the event the coded symbol is LPS—or, conversely, if renormalization is not required, then the coded symbol must be MPS. Similarly, all values of Q are determined to be less than Amin. Since the length of the lower subinterval is Q, this means that renormalization is always required when the lower subinterval is chosen (whether or not this represents LPS).

A known decoding algorithm 200 is shown in FIG. 2. This procedure decodes a single bit-value S. The sole input parameter is the coding context cx. On entering the procedure, the values of A and C retain their values from initialization or previous decoding operations. In either case these reflect data previously imported by the decoder from the input data stream. The values of MPS, LPS, Q, NMPS, and NLPS are precalculated and stored in look-up tables indexed by the context value cx. Amin is a fixed constant value depending on the implementation.

From start step 202, execution proceeds to step 204, wherein the decoded bit-value S is provisionally set to the MPS value for the given context cx, Q is set to the Q-value for the given context cx, and the total interval length A is provisionally set to the length A-Q of the upper subinterval. Execution then proceeds to step 206.

In step 206 the value of C is compared to Q (which also equals the value Csplit of the split point). If C equals or exceeds Q then the upper subinterval is chosen and execution proceeds to step 208. If C is less than Q then the lower subinterval is chosen and execution proceeds to step 222.

In step 208 the upper subinterval has been chosen. In step 208 the value Q (which equals the length of the lower subinterval) is subtracted from C to maintain the value of Cmin (not directly represented in the algorithm) at zero. Execution then proceeds to step 210.

In step 210 the upper subinterval has already been chosen. A was already updated to the length of this subinterval in step 204. In step 210 the value of A is compared to Amin to determine whether renormalization is necessary. If A is less than Amin, then renormalization is necessary and execution proceeds to step 214. Otherwise, renormalization is not necessary. As remarked above, this also guarantees that the coded bit-value is MPS. Since the bit-value S has previously been set to MPS in step 204, execution proceeds directly to the end 212 of the procedure.

In step 214 the upper subinterval has been chosen and it is known that renormalization is required. In step 214 the value of A (set in step 204 to the length of the upper subinterval) is compared to Q (the length of the lower subinterval) to determine which subinterval is longer and thus corresponds to the bit-value MPS. If A is less than Q, then the upper subinterval is shorter than the lower subinterval and execution proceeds to step 216. Otherwise execution proceeds to step 218.

In step 216 the upper subinterval has been chosen, it is known that renormalization is required, and the upper subinterval is shorter than the lower and hence corresponds to LPS. Since the bit-value S was provisionally set to MPS in step 204, in step 216 it is reversed by subtraction from 1. The context value cx is also updated to the context value NLPS. Execution then proceeds to the renormalization step 220.

In step 218 the upper subinterval has been chosen, it is known that renormalization is required, and the upper subinterval is not shorter than the lower and hence corresponds to MPS. Since the bit-value S was provisionally set to MPS in step 204, in step 218 it is unchanged. The context value cx is updated to the context value NMPS. Execution then proceeds to the renormalization step 220.

Step 220 performs the renormalization operation, wherein the values of A and C are successively doubled (and the rightmost bits of C are filled with new data from the input stream 221) until the value of A is not less than Amin. The details of this process are not relevant to the present invention. Execution then proceeds to the end 212 of the procedure.

In step 222 the lower subinterval has been chosen. As remarked above, in this case renormalization is always required. The value of A (provisionally set to the length of the upper subinterval in step 204) is compared to Q (the length of the lower subinterval) to determine which is longer and thus corresponds to the bit-value MPS. If A is less than Q, then the upper subinterval is shorter than the lower subinterval and execution proceeds to step 226. Otherwise execution proceeds to step 224.

In step 226 the lower subinterval has been chosen, it is known that renormalization is required, and the upper subinterval is shorter than the lower; the lower subinterval hence corresponds to MPS. Since the bit-value S was provisionally set to MPS in step 204, in step 218 it is unchanged. The context value cx is updated to the context value NMPS. Execution then proceeds to step 228.

In step 224 the lower subinterval has been chosen, it is known that renormalization is required, and the upper subinterval is not shorter than the lower; the lower subinterval hence corresponds to LPS. Since the bit-value S was provisionally set to MPS in step 204, in step 224 it is reversed by subtraction from 1. The context value cx is also updated to the context value NLPS. Execution then proceeds to step 228.

In step 228 the lower subinterval has been chosen and it is known that renormalization is required. In step 228 the total interval length A is updated to the length Q of the lower subinterval. Execution then proceeds to the renormalization step 220.

A fundamental assumption in entropy coding is that the bit-values 0 and 1 do not occur with equal frequency (otherwise, compression would be impossible). In the foregoing, therefore, the various branches of the algorithm are taken with generally unequal frequency. In particular the leftmost branch which includes steps 202-204-206-208-210-212 (in which the more probable symbol MPS is decoded) is likely to be executed with greater frequency than the others—almost 100% in the case where the confidence level P is almost 1 (and the lower subinterval length Q is almost zero). This branch of the algorithm is thus termed the common decoding path (CDP). The rest of the algorithm (steps 214-220) is termed the non-common decoding path (non-CDP).

On the other hand, in the worst-case scenario where the confidence level P is 0.5, the so-called common decoding path is executed almost never or not at all—because renormalization is required for almost every decoded bit-value. The confidence level P depends on issues outside the MQ-coder: the inherent nature of the data and the sophistication of the algorithm controlling the MQ-coder.

Many efforts in the prior art to improve on Algorithm 200 focus on streamlining the common decoding path. One known approach to providing an improved decoding algorithm which can be used in place of the method shown in FIG. 2 is the decoding method 300 shown in FIG. 3. The method 300 utilizes a variable D (termed here the base value), which is not used in the FIG. 2 decoding method. The value D is used to reduce the two comparison operations entailed in the common decoding path of FIG. 2 to one in the method 300. D is defined to be the minimum of A−Amin and C. The variables A and C then for much of the time (between decoding operations and throughout the common decoding path) do not hold their "full" values of Algorithm 200 but rather "discounted" values:

$$(\text{discounted})A = (\text{full})A - D;$$

$$(\text{discounted})C = (\text{full})C - D.$$

State variables for this modified algorithm are shown in Table II.

TABLE II

| | |
|---|---|
| D | base value; minimum of (full) value of A-Amin and C. |
| A | discounted total interval length |
| C | discounted code value |

The resulting streamlined common decoding path is illustrated in FIG. 3 as steps 302-304-306-308 which are equivalent in purpose to steps 202-204-206-208-210-212 of the method 200.

The known improved decoding method 300 will now be discussed in detail. From start step 302, execution proceeds to step 304, wherein the decoded bit-value S is provisionally set to the MPS value for the given context cx, Q is set to the Q-value for the given context cx, and Q is subtracted from D. Since at this point both A and C hold their discounted values, this single subtraction operation effectively accomplishes both the subtraction of Q from A in step 204 and the subtraction of Q from C in step 208. Execution then proceeds to step 306.

In step 306, the value of D is compared to zero. Recall that D equals the minimum of (full) A−Amin and (full) C. Thus if D is not less than zero, then neither (full) A−Amin nor (full) C is less than zero. The condition (full) A−Amin$\geq$0 is equivalent to A$\geq$Amin in step 210. Moreover, since effectively Q has already been subtracted from C, the condition C$\geq$0 is equivalent to C$\geq$Q in step 206. Thus this single comparison operation effectively performs both comparisons needed in the common decoding path, and if D$\geq$0, then the decoded bit-value is necessarily MPS and it is known that renormalization is not required. Execution then proceeds to the end 308 of the procedure.

If D<0 in step 306, then execution proceeds to the non-common decoding path in step 310.

Introduction of the new variable D also requires modification of the non-common decoding path. The prior art includes one method 400 for implementing a non-common decoder path, step 310 of FIG. 3, which is shown in FIG. 4.

The known non-CDP method 400 for use with the method 300, begins in start step 402. From start step 402, execution proceeds to step 450. In step 450, variables A and C are restored from their discounted values to their full values by adding D to each. Execution then proceeds to step 406.

Step 406 is equivalent to step 206. In step 406, the value of C is compared to zero. Since in this version, Q has previously in effect been subtracted from C in step 304, comparing C to zero here is equivalent to comparing C to Q in step 206. This comparison indicates whether the upper or lower subinterval is chosen. If C$\geq$0, the upper subinterval is chosen and execution proceeds to step 414; otherwise, the lower subinterval is chosen and execution proceeds to step 452.

Step 414 is directly equivalent to step 214. In step 414, A is compared to Q to determine which of the upper or lower subinterval is larger. If A is less than Q, execution proceeds to step 416; otherwise execution proceeds to step 418.

Step 416 is directly equivalent to step 216. Here it has been determined that the upper subinterval is chosen and corresponds to LPS. The bit-value S, which in step 304 was provisionally set to MPS, is converted to LPS by subtraction from 1. Also, the context value cx is updated to NLPS. Execution then proceeds to the renormalization step 420.

Step 418 is directly equivalent to step 218. Here it has been determined that the upper subinterval is chosen and corresponds to MPS. The bit-value S, which in step 304 was provisionally set to MPS, is unchanged. The context value cx is updated to NMPS. Execution then proceeds to the renormalization step 420.

Step 420 is directly equivalent to step 220. This step performs the renormalization. Execution then proceeds to step 454.

Steps 454-456-458-460 have no equivalents in the known method 200. These steps prepare the values of D, A, and C for the end of this call to the decoding procedure. In step 454 D is set to the value A−Amin. Execution then proceeds to step 456.

In step 456 the value of C is compared to that of D. If C is less than D, then execution proceeds to step 458. Otherwise, D is already set to the minimum of A−Amin and C and execution proceeds to step 460.

In step 458, the value of D is set to that of C, thus making D equal to the minimum of A−Amin and C. Execution then proceeds to step 460.

In step 460, A and C are converted from their full values to their discounted values by subtracting D. Execution then proceeds to the return step 412 of the procedure.

Step 452 has no equivalent in Algorithm 200. In step 452, the value of Q is added to C. This undoes the subtraction of Q from C that previously was effectively performed in step 304. Execution then proceeds to step 422.

Step 422 is directly equivalent to step 222. In step 422, A is compared to Q to determine which of the upper or lower subinterval is larger. If A is less than Q, execution proceeds to step 426; otherwise execution proceeds to step 424.

Step 426 is directly equivalent to step 226. Here it has been determined that the upper subinterval is chosen and corresponds to MPS. The bit-value S, which in step 304 was provisionally set to MPS, is unchanged. The context value cx is updated to NMPS. Execution then proceeds to step 428.

Step 424 is directly equivalent to step 224. Here it has been determined that the lower subinterval is chosen and corresponds to LPS. The bit-value S, which in step 304 was provisionally set to MPS, is converted to LPS by subtraction from 1. Also, the context value cx is updated to NLPS. Execution then proceeds to step 428.

Step 428 is directly equivalent to step 228. In step 428 the total interval length A is updated to the length Q of the lower subinterval. Execution then proceeds to the renormalization step 420.

This modified decoding method 300 of FIG. 3, which uses the NCP method of FIG. 4, entails a trade-off between a reduced number of operations in the common decoding path and an increased number of operations in the non-common decoding path. The actual difference in performance between this algorithm and the "standard" version 200 is largely a question of how often the common decoding path is executed versus the non-common decoding path—a question, as earlier noted, dependent on factors external to the MQ-coder. If the common decoding path is used for a large majority of bit-values decoded, then the modified version can manifest a significant speed advantage over the standard version. If the common decoding path is used less frequently, the modified algorithm may show less of a speed advantage or even be slower on average than the standard version.

While the decoding method 300 of FIG. 3 offers potential advantages over the method 200 of FIG. 2, there remains room for improvement with regard to how the non-CDP is implemented. In particular, benefits could be achieved if an improved alternative to the non-CDP method 400 could be used with the decoding method shown in FIG. 3.

To facilitate an understanding of some of the issues associated with implementing a fast decoding method using software, a brief review of some basic computer issues relating to fast software execution will now be discussed.

Instruction pipelining and parallelism. Even an ostensibly serial-execution microprocessor such as a Pentium manifests a significant degree of parallelism in instruction execution—parallelism profitably enhanced by careful code design. Execution of a single microprocessor operation such as an addition entails performance of several sub-tasks. The instruction itself must be fetched from memory, then interpreted. Perhaps one of the argument values must be again fetched from memory before the operation is actually performed. In order to execute a sequence of operations O1, O2, O3, . . . quickly, the processor "pipelines" the processing. For example, while operation O1 is actually being executed, simultaneously the argument value for operation O2 may be fetched from memory, operation O3 may be in the process of interpretation, and operation O4 may be fetched from memory. The details of this pipelining vary from one processor to another, but the basic principle is widespread.

Modern microprocessors go even further by parallelizing execution, for example perhaps simultaneously executing operations O1 and O2, fetching arguments for operations O3 and O4, interpreting operations O5 and O6, and fetching operations O7 and O8. This parallelization is subject, however, to an important constraint. Operations O1 and O2 cannot be executed simultaneously if both must modify the same register or memory location (such a pair of operations is inherently sequential in nature). Careful code design, minimizing the immediate adjacency of such pairs of non-parallelizable operations, can theoretically increase execution speed by a factor of two over the worst case.

Branch-Prediction Penalty

Pipelining of operations requires special finesse in the event that the program "branches"—transfers control to a non-contiguous location in memory. Branches are a necessary feature for program loops and conditional execution and appear frequently in any but the most straightforward and uncomplicated programs.

A branch complicates the pipelining of operations because the operation to be executed two steps after operation O1 may not be the nearby operation O3 but an operation O100 at some distant memory location. It is therefore useless for the processor to interpret operation O3 simultaneously with the execution of O1. Microprocessors have grown increasingly sophisticated in their ability to pipeline operations separated by branches, but this sophistication entails unintended and undesired consequences if not accounted for in program design.

A program branch may be conditional or unconditional. An unconditional branch is simply a transfer of control which happens identically regardless of conditions. The unconditional branch is the easiest and was the earliest to be reconciled with instruction pipelining; the instructions fed into the pipeline are simply taken from the far end of the branch rather than immediately subsequent locations in memory.

A conditional branch may or may not take place depending on processor status when the branch instruction is reached. For example, the branch may or may not be executed depending on whether the result of the immediately preceding operation was positive, or negative, or an overflow. (In a flowchart a conditional branch is recognizable as associated with each decision "diamond" symbol.) Conditional branches are difficult to reconcile with instruction to be pipelined because which of two possible locations the next instruction to be fed to the pipeline is located is impossible to predict given the information available at the time the instruction is fed.

The approach taken is to attempt to predict whether the branch will be taken based on previous history executing the same body of code. The details of the method used to make this prediction vary from one processor to another and are of little importance; the important point is that when the prediction is correct there is no interruption to the instruction pipeline. On the other hand, an incorrect prediction entails a large time penalty.

Branch prediction is of greatest benefit when applied to a branch such as the end of a loop, which may be taken many times (once for each execution of the loop) and declined only once (when exiting the loop). The large time penalty for the final, incorrect prediction is thus offset by the many correct predictions which avoided interruption of the instruction pipeline.

Branch prediction is most problematic for a conditional branch which is repeatedly both taken and declined on an unpredictable basis.

In order to support computer processing of values, standardized method of representing integer and other values using the binary values which are processed by computers have been developed. The following discussion applies to the Intel family of processors and to many other computers which internally represent numbers according to similar principles.

Most computers represent integer values in base-2 as a sequence of N bit values, were N is a number characteristic of the processor, 32 being a popular value. For purposes of illustration we consider the case N=8.

An integer value such as 57 is therefore represented as a sequence of eight bit-values:

$$00111001$$

which is to be interpreted as $$0\times2^7+0\times2^6+1\times2^5+1\times2^4+1\times2^3+0\times2^2+0\times2^1+1\times2^0=57.$$

An obvious difference between this representation and the set of actual integer values is that with N bit-values only $2^N$ different representations are possible, whereas the integers are infinite in number. The consequence of this is that different integer values sometimes an share the same representation. For example, the value 256 can be written in base-2 as:

$$1\times2^8+0\times2^7+0\times2^6+0\times2^5+0\times2^4+0\times2^3+0\times2^20\times2^1+0\times2^0,$$

but with only N=8 bit-values available for representation, the leftmost bit-value 1 cannot be represented; the 8-bit representation of this value thus becomes:

$$00000000$$

which is identical to the representation for zero. As a convention the 8-bit sequence 00000000 is almost always interpreted as zero rather than 256 or some other nonzero value.

More generally, any pair of integer values K and $K+2^N$ share the same N-bit representation. This fact is exploited for the representation of negative numbers. If a negative number K lies in the range $-2^{N-1}$, $-2^{N-1}+1$, $-2^{N-1}+2$, ..., $-1$, then $K+2^N$ lies in the range $2^{N-1}$, $2^{N-1}+1$, $2^{N-1}+2$, ..., $2^N-1$. Common practice when it is desired to represent both positive and negative values is to interpret binary values in the range $2^{N-1}$, $2^{N-1}+1$, $2^{N-1}+2$, ..., $2^N-1$ as negative values in the range $-2^{N-1}$, $-2^{N-1}+1$, $-2^{N-1}+2$, ..., $-1$ by subtracting $2^N$ from each. For example, to find the representation of the value $-57$, one first adds $2^8=256$:

$$-57+256=199.$$

The binary representation for 199:

$$199=1\times2^7+1\times2^6+0\times2^5+0\times2^4+0\times2^3+1\times2^2+1\times2^1+1\times2^0,$$

(or 11000111) is interpreted as representing the value −57.

An important characteristic of this system of representation is that negative value are immediately distinguishable from non-negative values in that the leftmost bit-value is 1 for all negative values and is 0 for all non-negative values.

In order to support various commonly used processing operations, general purpose processors normally include hardware to facilitate rapid execution of various commonly used arithmetic and logic operations. Operations which are normally supported in an execution efficient manner include: the right arithmetic shift (denoted here SAR); bit-wise XOR operation, the right logical shift (SLR), and logical AND operations.

The right arithmetic shift (denoted here SAR) takes two input arguments: a first argument comprising an integer value with an N-bit representation and a second argument R comprising a non-negative integer value. The bit-value of the result at location J bits from the left equals the bit-value of the first input argument J-R positions from the left. If (J-R) is less than zero, then the output bit-value equals the leftmost bit-value of the first input argument.

For example, if N=8 and the first input argument has binary representation 11100111, then:

SAR(11100111,0)=11100111;

SAR(11100111,1)=11110011;

SAR(11100111,2)=11111001;

SAR(11100111,3)=11111100;

SAR(11100111,4)=11111110;

SAR(11100111,5)=11111111;

SAR(11100111,6)=11111111;

SAR(11100111,7)=11111111;

SAR(01100111,R)=11111111 for all R>7.

A particular special case of interest is SAR(X,N-1), in which all bit-values are identically 0 or 1, depending on whether the input argument X is negative (1 in the leftmost bit-position) or non-negative (0 in the leftmost bit-position).

The bit-wise AND operation takes as input two arguments, each with an N-bit representation. The bit-value of the result at location J bits from the left equals 1 only if the corresponding bit-values of both input arguments at location J bits from the left equal 1 and equals 0 otherwise. For example:

11100111 AND 01010101=01000101;

11100111 AND 11110000=11100000;

11100111 AND 00001111=00000111;

11100111 AND 11111111=11100111;

11100111 AND 00000000=00000000.

Two particular special cases of interest are when the second input argument has binary representation all zeros—in which case the result is likewise all zeros—and when the second input argument has binary representation all ones—in which case the result matches the first input argument exactly.

The bit-wise XOR operation takes as input two arguments, each with an N-bit representation. The bit-value of the result at location J bits from the left equals 1 if the two corresponding bit-values of both input arguments at location J bits from the left differ in value and equals 0 otherwise. For example:

11100111 XOR 01010101=10110010;

11100111 XOR 11110000=00010111;

11100111 XOR 00001111=11101000;

11100111 XOR 11111111=00011000;

11100111 XOR 00000000=11100111.

The right logical shift (SLR) differs from the right arithmetic shift in only one respect. It takes two input arguments: a first argument comprising an integer value with an N-bit representation and a second argument R comprising a non-negative integer value. The bit-value of the result at location J bits from the left equals the bit-value of the first input argument J-R positions from the left. If (J-R) is less than zero, then the output bit-value equals zero (whereas for the right arithmetic shift it equals the leftmost bit-value of the first input argument).

For example, if N=8 and the first input argument has binary representation 11100111, then:

$SLR$(11100111,0)=11100111;

$SLR$(11100111,1)=01110011;

$SLR$(11100111,2)=00111001;

$SLR$(11100111,3)=00011100;

$SLR$(11100111,4)=00001110;

$SLR$(11100111,5)=00000111;

$SLR$(11100111,6)=00000011;

$SLR$(11100111,7)=00000001;

$SLR$(01100111,$R$)=00000000 for all $R$>7.

A particular special case of interest is SLR(X,N-1), which takes the value 1 or 0, depending on whether the input argument X is negative (1 in the leftmost bit-position) or non-negative (0 in the leftmost bit-position).

While the benefits of branch avoidance for the design of fast software is well known, in practice the it has proven difficult to avoid the use of branches in software implementations of decoding and other types of complicated processes. For example, the above described known decoding method uses branches in the common decoding path as part of the known decoding process. Such branches can slow computer implementation of the known decoding method in the case where branch predictions turn out to be wrong.

In view of the above discussion, it should be apparent that there is a need for improved decoding methods which can be used to facilitate decoding of JPEG 2000 encoding image data and/or other image data which requires decoding processing similar to that required to decoded JPEG 2000 image data. From an implementation standpoint, it is desirable that any new methods avoid or minimize the use of branches during decoding without introducing unnecessary deals or other processing requirements that significantly lessen any implementations advantages gained by reducing or avoiding branches during processing. Furthermore, from a customer acceptance perspective, it is desirable that any new decoding methods or procedures be compatible with existing general purpose processors such as Pentium and similar computers to avoid the need for customers to purchase special hardware or new processors.

As will be discussed below, a novel non-common decoding path method of the present invention can be used in combination with the method 300, in place of the known method 400, to provide a novel MQ-decoding method which is superior to the combination of methods 300 and 400.

SUMMARY OF THE INVENTION

The present application is directed to improved methods and apparatus for providing JPEG decoder functions. In particular, features and methods of the present invention are directed to an efficient way of implementing a non-common decoding path function used in an MQ-coder, such as the type used to decode JPEG-2000 images. The methods of the present invention are well suited for implementation on general purpose computers such as conventional personal computers (PCs) and can provide improved decoding speed, compared to known systems which use processing branches as part of a non-common decoding path function by reducing and, in some implementations completely avoiding, branches. Thus, branch prediction penalties associated with known decoding schemes are reduced or avoided leading, in many cases, to faster decoding rates when using a general purpose processor of a given speed or computational capability. The system of using bit-value sequences with a leftmost bit-value of 1 to represent negative values together with creative use of the arithmetic and logical operations available on most processors sometimes allows the replacement of an unpredictable conditional branch with a not-too-long sequence of calculations achieving the same result with no branch, resulting in faster execution.

BRIEF DESCRIPTION OF THE FIGURES

FIG. 1A illustrates an exemplary MQ encoder and its various inputs and outputs.

FIG. 1B illustrates an exemplary MQ decoder and its various inputs and outputs.

DETAILED DESCRIPTION

The present application is directed to improved MQ decoder methods and apparatus. The methods and apparatus of the present invention can, and in various embodiments are, used in place of the known method 400 of implementing non-common path decoding in an MQ decoder. In some embodiments, the methods of the present invention are implemented using software on a general purpose computer to perform decoding operations, e.g., JPEG-2000 decoding of images. In such an embodiment, the coded data which is processed, and the decoded data which is produced by decoding using the methods and/or apparatus of the present invention, are data which represents one or more images or portions of an image.

Figure 2:
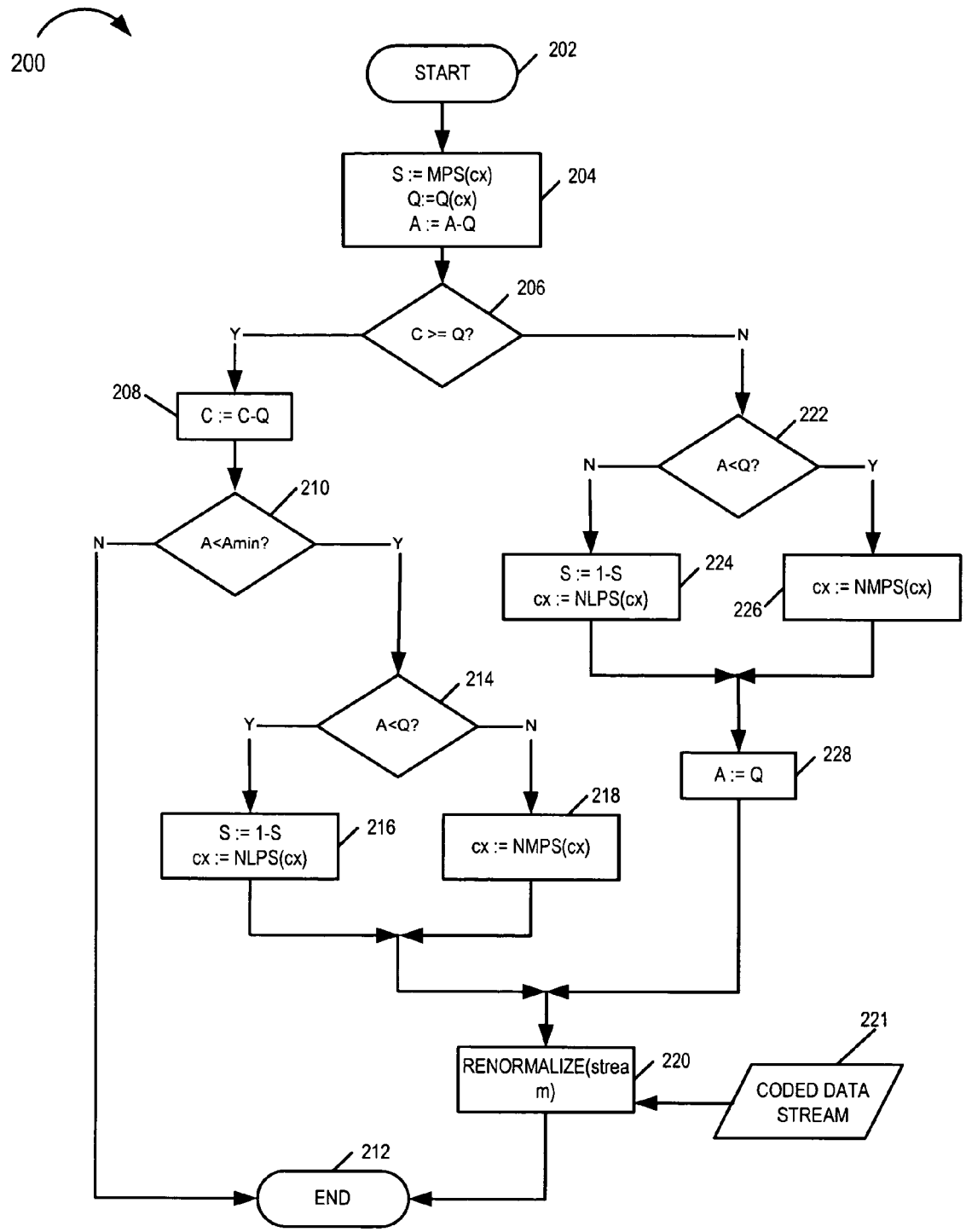
FIG. 2 illustrates a known MQ-decoder method.
Figure 3:
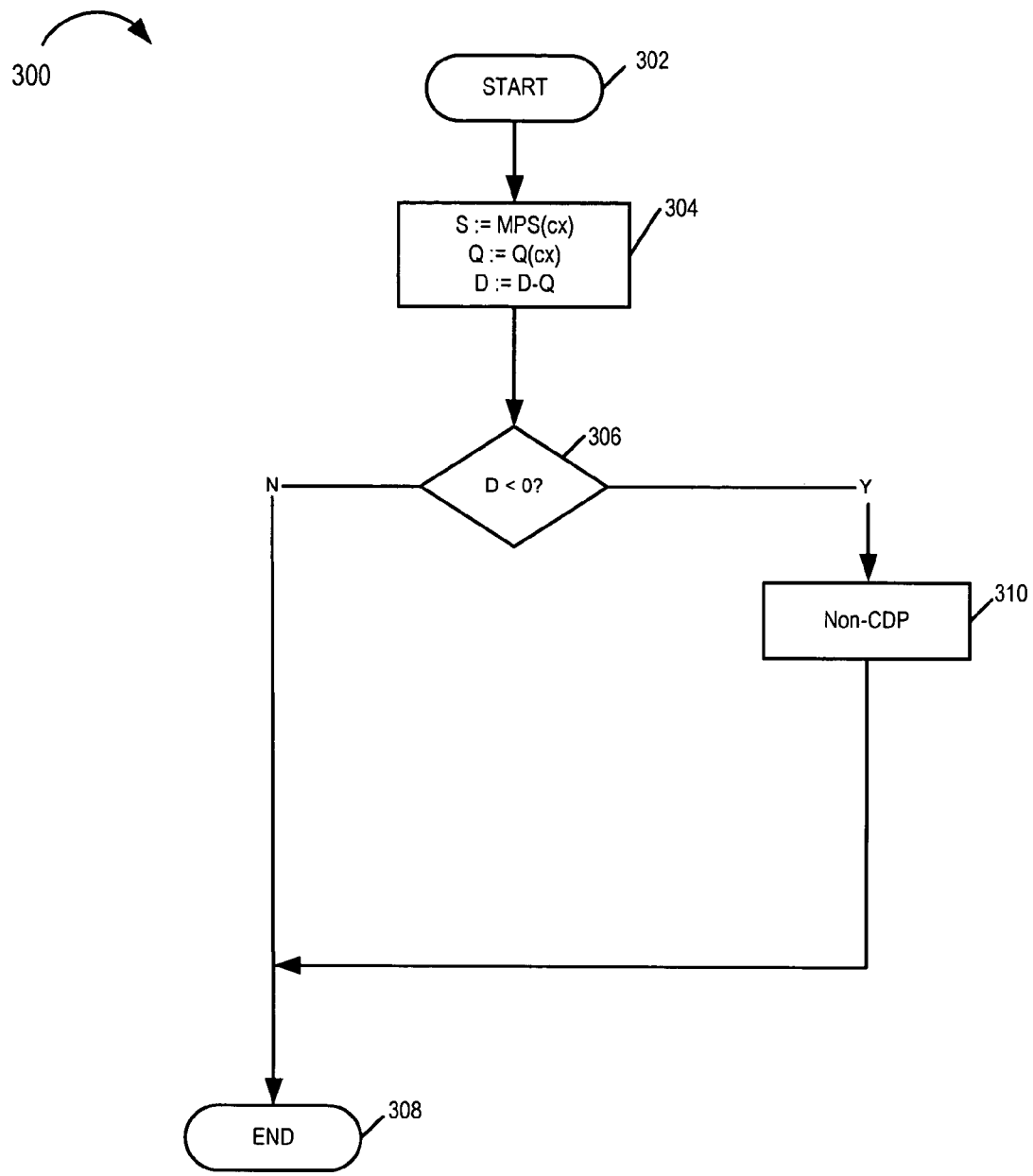
FIG. 3 illustrates an improved known MQ-decoder method.
Figure 4:
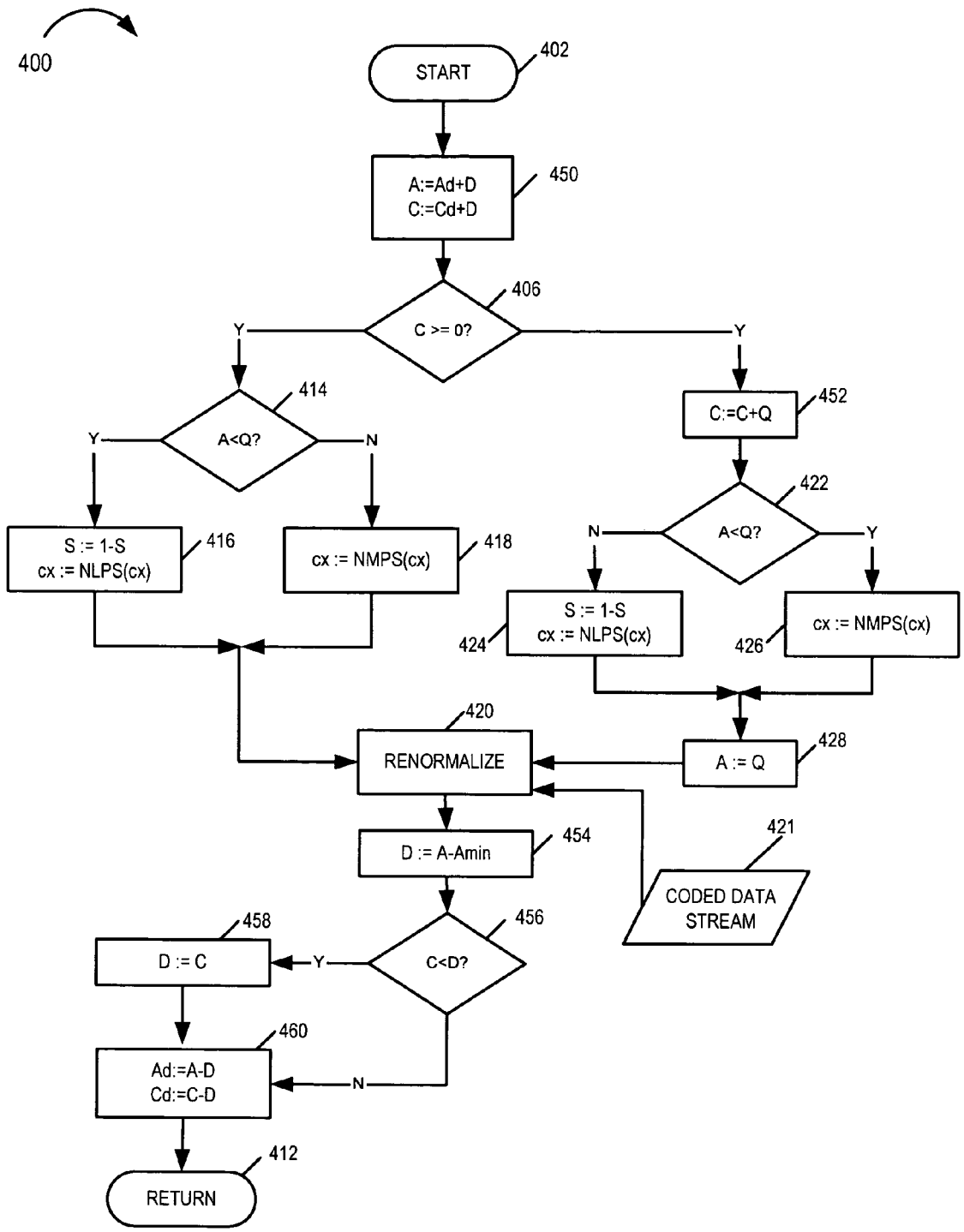
FIG. 4 illustrates a known method for non-common-path decoding, which has been used with the known decoding method shown in FIG. 3.

The methods of the present invention are well suited for implementation on general purpose computers such as conventional personal computers (PCs) and can provide improved decoding speed, compared to known systems which use processing branches as part of a non-common decoding path function by reducing and, in some implementations completely avoiding, branches. Thus, branch prediction penalties associated with known decoding schemes are reduced or avoided leading, in many cases, to faster decoding rates when using a general purpose processor of a given speed or computational capability. The use of bit-value sequences with a leftmost bit-value of 1 to represent negative values, as done in many systems, is used together with arithmetic and logical operations available on most processors, in creative manner corresponding to the invention, which allows the replacement of conditional branches with a not-too-long sequence of calculations achieving the same result with no branch, usually resulting in faster execution than would be achieved using the known method of FIG. 4 which includes several branches.

Figure 5:
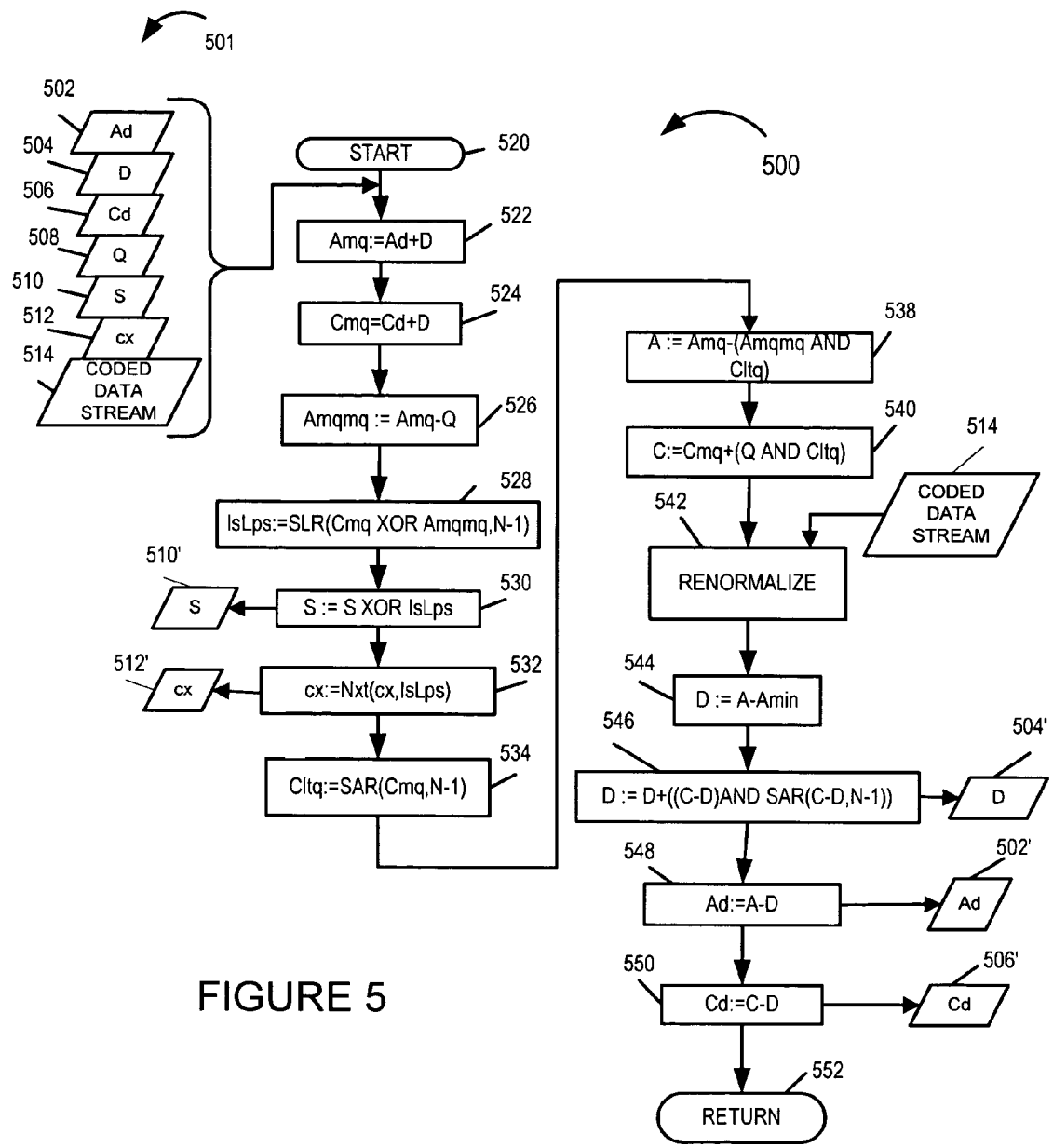
FIG. 5 illustrates an improved non-common path decoding method of the present invention for use in performing MQ decoding operations, which can be used in the decoding method of FIG. 3 in place of the method 400 shown in FIG. 4.

The present invention is directed to methods and apparatus for performing non-common path decoding in an MQ-coder without the use of unpredictable branches or, in the case of the FIG. 5 embodiment, without any branches whatsoever. The FIG. 5 method corresponds to a non-common path decoding method of the invention which, in some embodiments, is implemented using software which is stored in memory and, when executed, causes the processor to implement the steps shown in FIG. 5 to perform non-common path decoding.

FIG. 5 which illustrates an exemplary non-CPD method 500 implemented in accordance with the present invention will now be discussed in detail. The non-CPD method 500 is used, in some embodiments to replace the known method shown in FIG. 4 when implementing method 300. Such an embodiment results in a novel MQ decoding method which has the common path decoding benefits of the method 300 while having the added benefit of the novel non-common decoding path method 500 of the present invention.

The method 500 uses a novel underlying data structure that is used to facilitate rapid decoding. In all previous algorithms, two data elements associated with each possible coding context cx are the next context values NMPS and NLPS. Method 500 uses a novel datastructure, e.g., look-up table 900 shown in FIG. 9, where these values are arranged and stored in a look-up table, a Nxt lookup function table, that has two possible values, an NMPS value and an NLPS value, for each entry in the Nxt lookup table corresponding to context state cx which is used as one index into the Nxt lookup table. A second index which can assume a 0 or a 1 value is used to determine which of the Nxt table entries, e.g., the NMPS or NLPS value corresponding to cx value, is to be retrieved. The function of the novel Nxt lookup table 900 can be expressed as follows:

$Nxt(cx,0)=NMPS(cx)$ and $Nxt(cx,1)=NLPS(cx)$.

Figures 7, 7C:
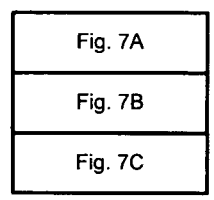
FIG. 7, which comprises the combination of FIGS. 7A-7C illustrates an NMPS value table which can be used by the decoding methods of FIGS. 2 and 3 to determine an NMPS value from context value, cx, which is used as an index into the illustrated table.
Figure 8A:
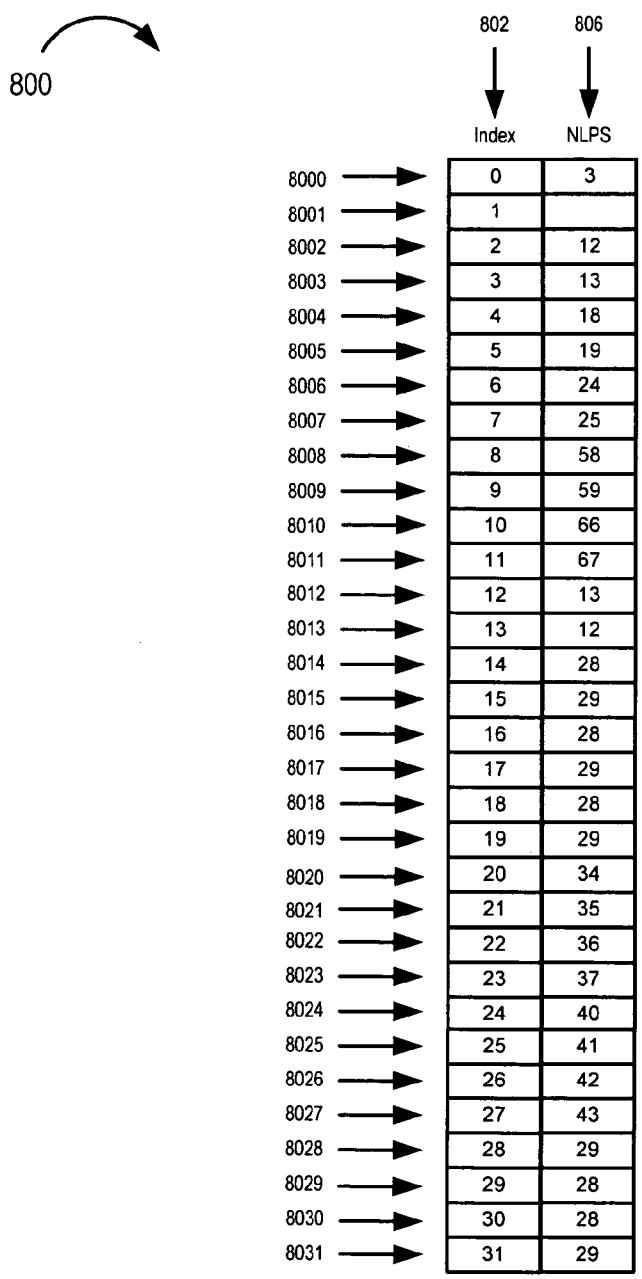
FIG. 8, which comprises the combination of FIGS. 8A-8C illustrates an NLPS value table which can be used by the decoding methods of FIGS. 2 and 3 to determine an NLPS value from context value, cx, which is used as an index into the illustrated table.
Figure 9A:
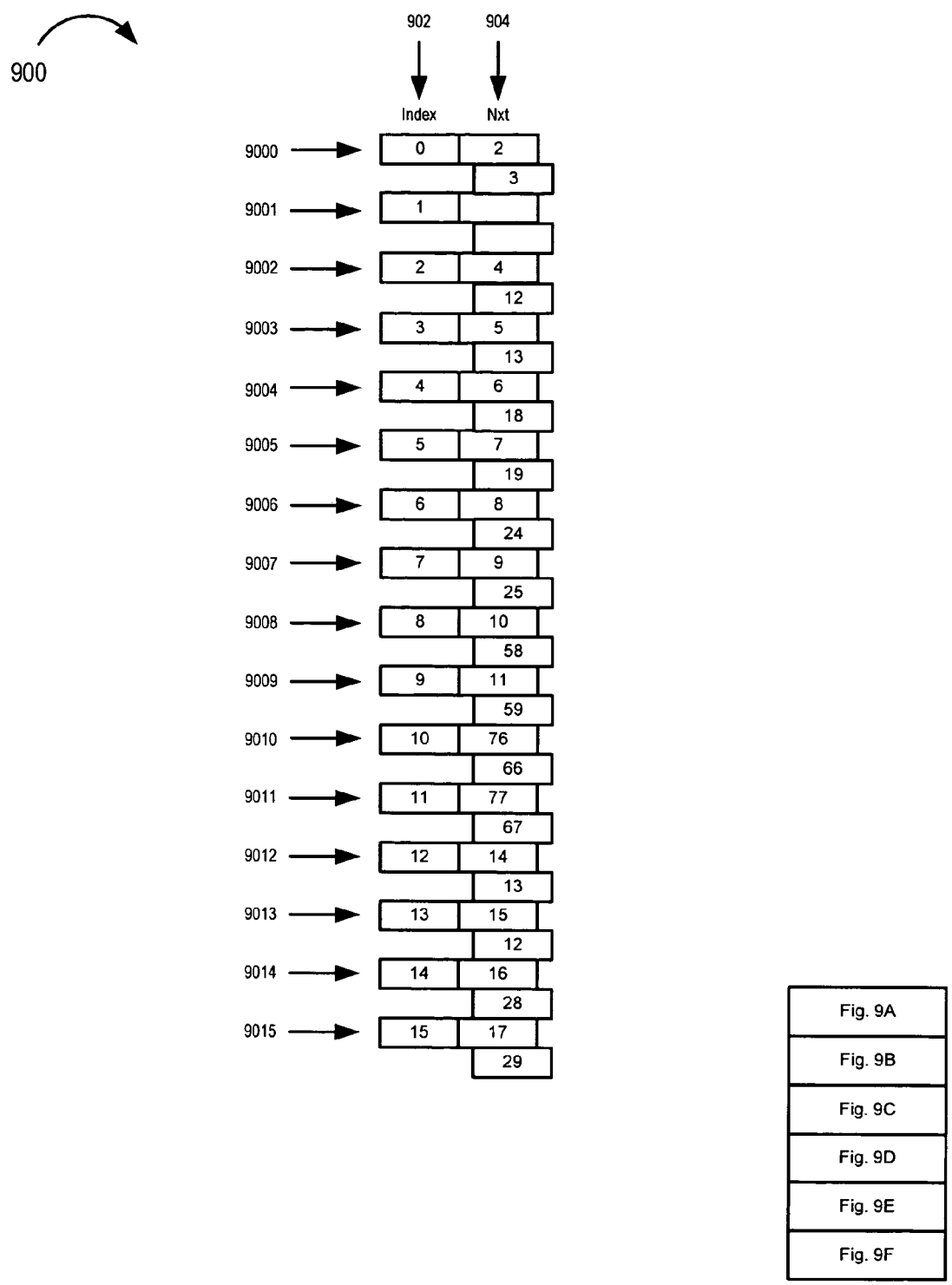
FIG. 9, which comprises the combination of FIGS. 9A through 9F illustrates a set of NMPS and LPS values which can be used by the method of FIG. 5, which uses to index values to access the table 900, to select either an NMPS or an NLPS value.
Figure 9B:
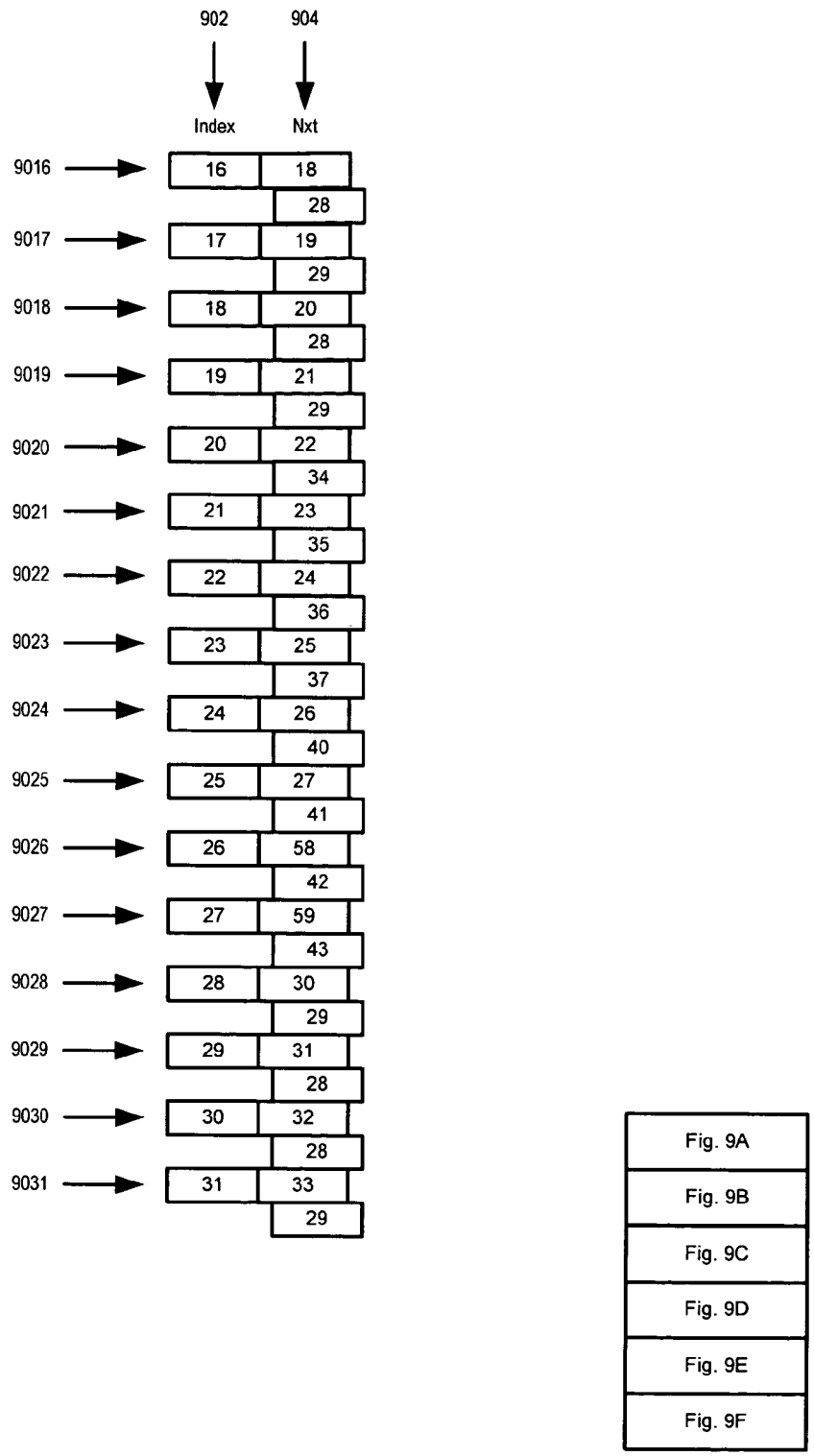
Figure 9C:
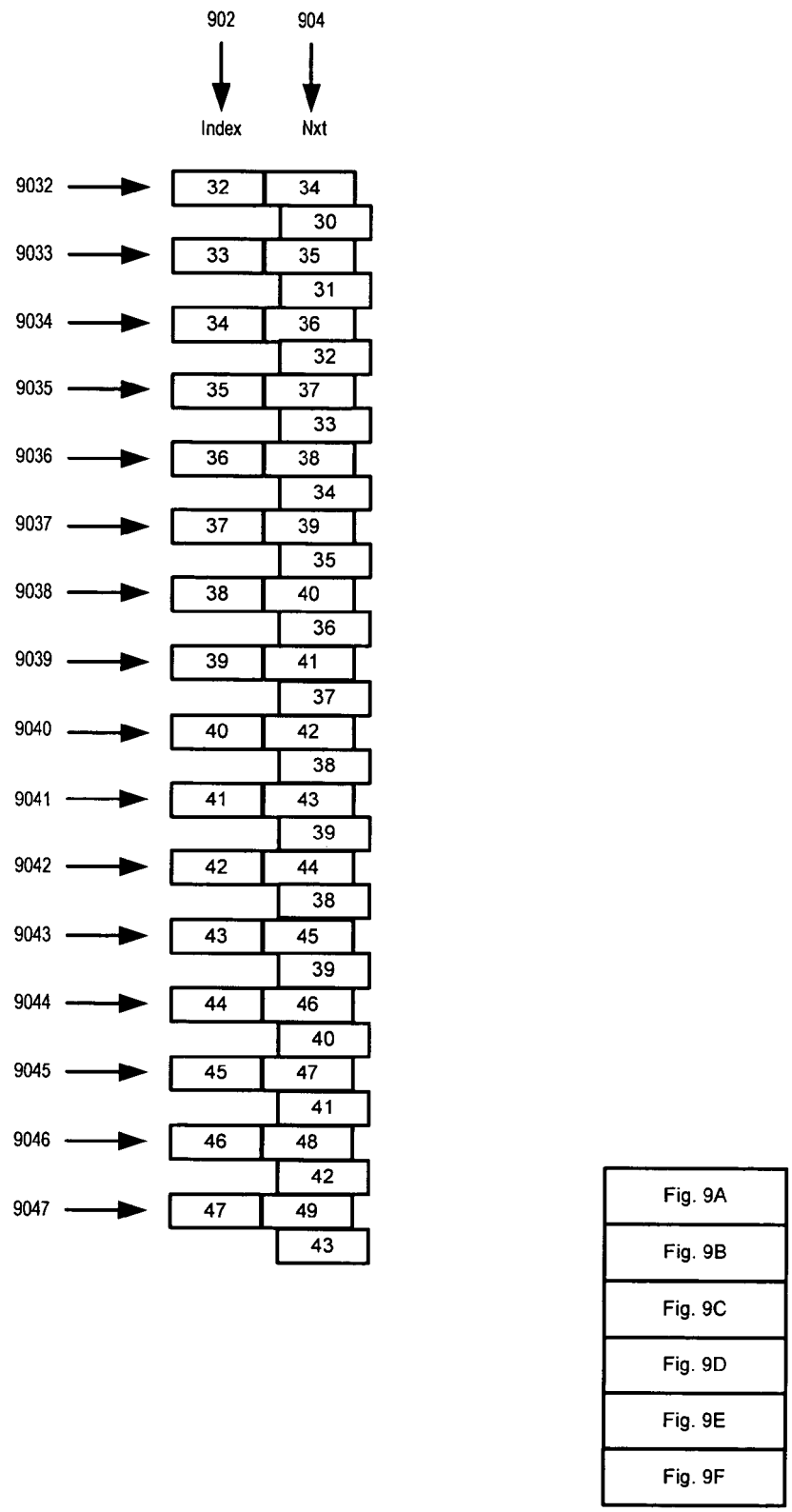
Figure 9D:
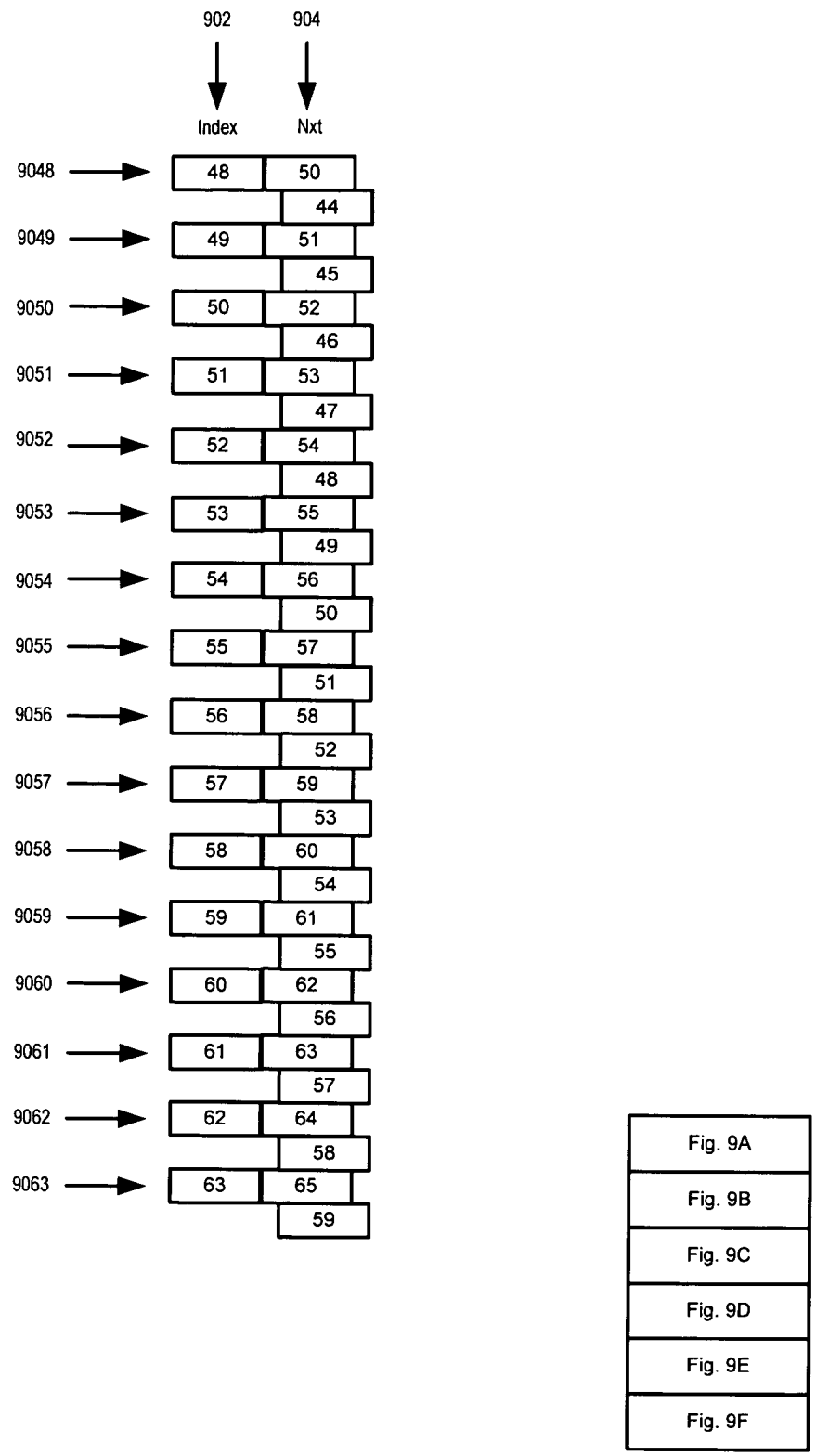
Figure 9E:
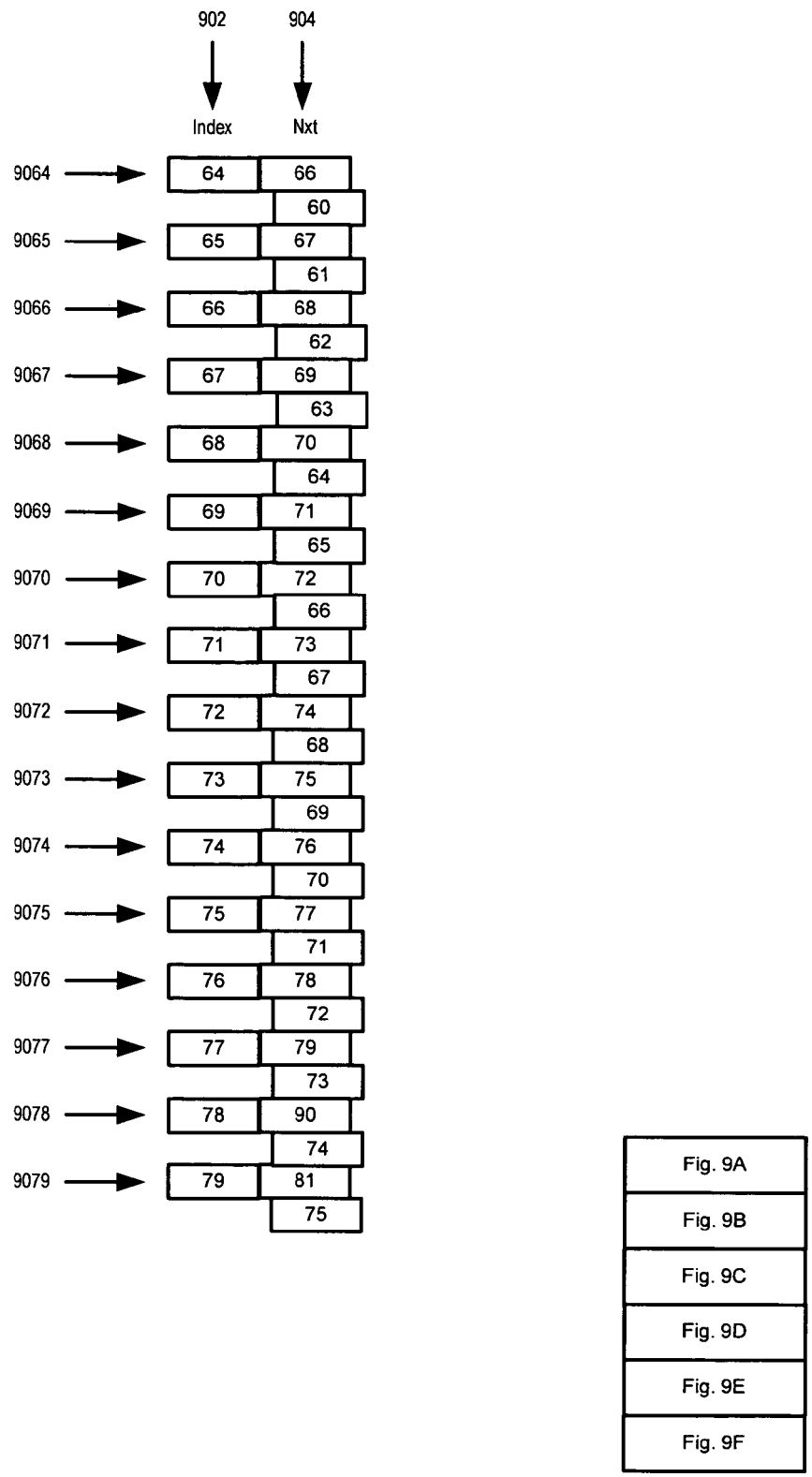
Figure 10:
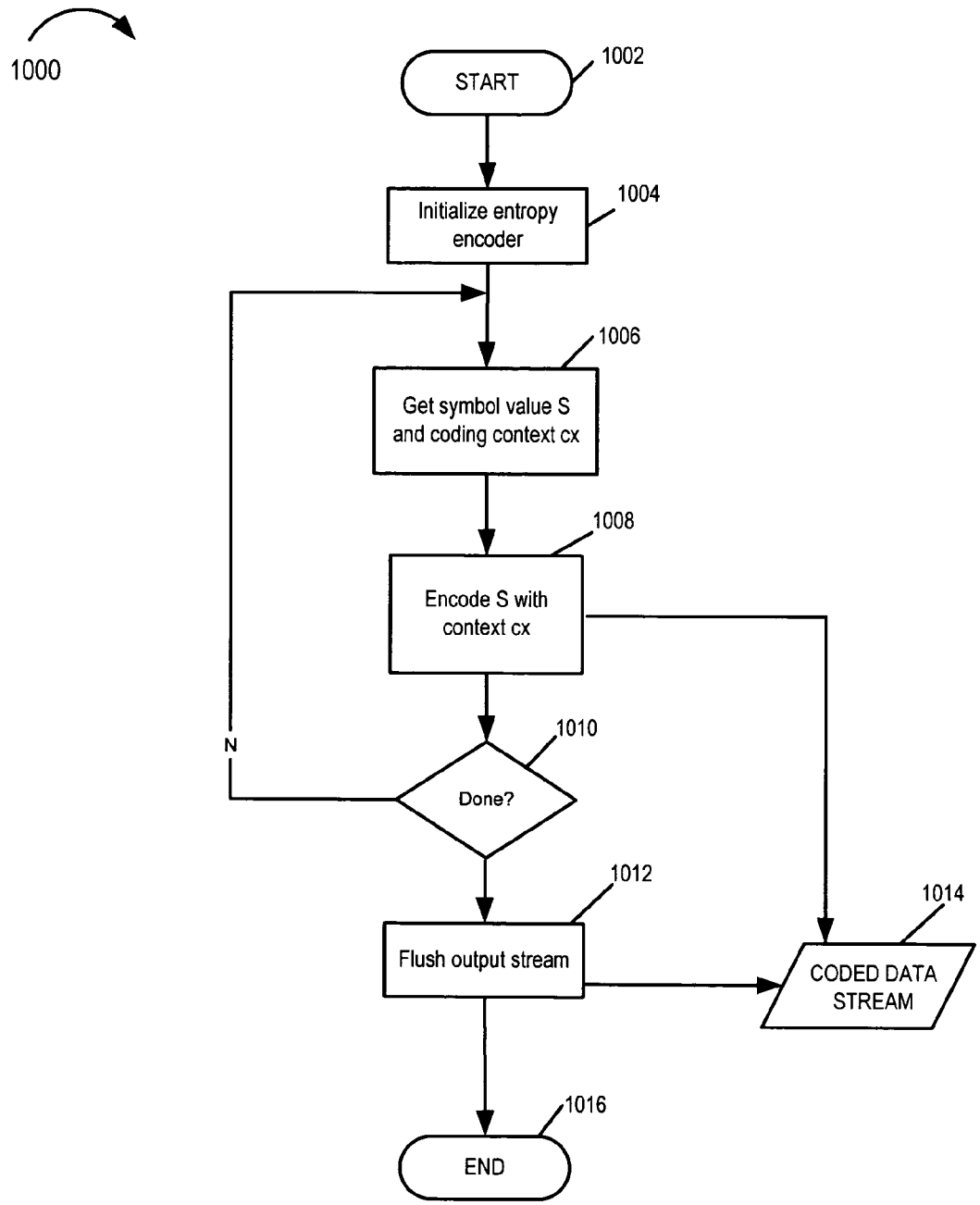
FIG. 10 illustrates the steps of a known entropy encoding method.
Figure 11:
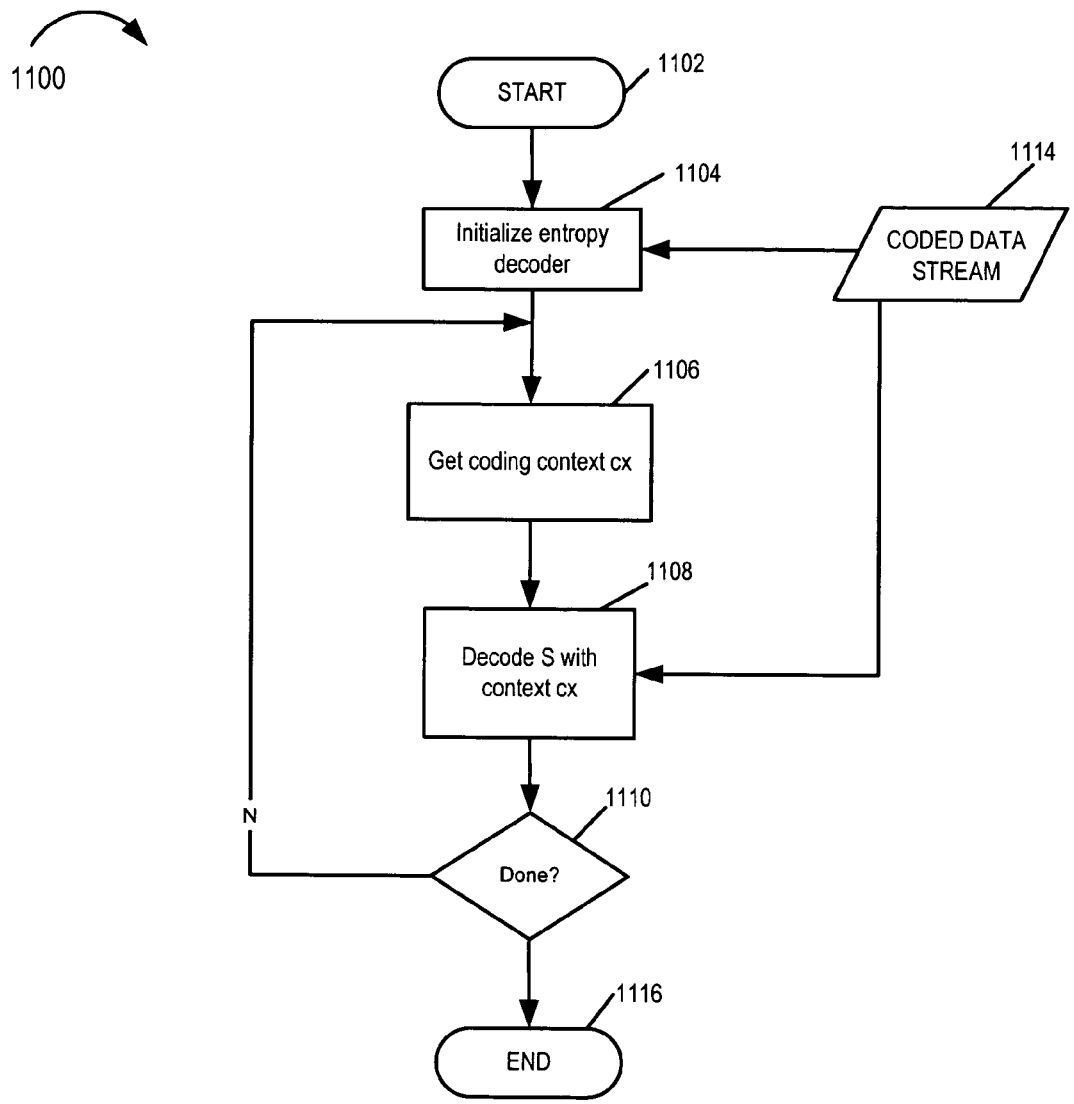
FIG. 11 illustrates the steps of a known entropy decoding method.

This manner of looking up the NLPS or NMPS value has implementation and execution efficiencies as compared to maintaining two separate lookup table for the NLPS and NMPS values as done previously, e.g., using separate tables such as those shown in FIGS. 7 and 8.

The non-common decoder path (non-CDP) decoding method 500 will now be described in detail. The method begins in start step 520, e.g., when called by a MQ-decoding routine such as the routine 300 which calls an non-CDP routine in step 310.

Input 501 to the non-CPD routine 520 includes the values Ad 502, D 504, Cd 506, Q 508, S 510, cx 512 and the coded data stream 514 being processed. Ad 502 is a discounted total interval length and is equal to (A+Q−D) where A is a total interval length being used. D 504 is a base value which is the minimum of (A−Amin−Q) and (C−Q), and where C is the value of the coded value being decoded, Amin is a minimum allowable value for A which is fixed for a given decoder application, and Q is a lower subinterval length. Cd 506 is the code value C plus Q minus D. Q 508 is a lower subinterval length. Since the total interval length being used for decoding is A and the lower subinterval length is Q, the upper subinterval length is (A−Q) which, for purposes of explaining the invention will be represented as Amq. The input value S is the predicted bit value. cx is the context value to be used for decoding. The coded data stream 514 is, as the name implies, the set of coded data, to be decoded.

Having described the inputs to the non-CDP routine 500, the outputs will now briefly be described. The method 500 generates updated S 510', cx 512', D 504', Ad 502' and Cd 506' values. A ' (prime) is used following the number to indicate that the value of the parameter has been updated from that of the input value to reflect processing performed by the method 500. The updated values may be used as the input to, e.g., a subsequent iteration of the method 500.

In start step 520, the method 500 begins. In start step 502, routine including software instructions used to cause a general purpose processor to implemented the method 500 begins being executed by the general purpose processor. This may be in response to a call from a main MQ-decoding routine which also performs common path decoding. In addition, in start step 520 the input 501 is received for processing.

Operation proceeds from start step 520 to step 522. In step 522 the value Amq, the length of the upper subinterval portion of A, is calculated as follows: Amq=Ad+D. Next, in step 524, the value Cmq, which is the code value C minus Q, is calculated as Cmq=Cd+D. The value Cmq can be used to determine whether C−Q is non-negative, e.g., 0 or a positive integer, by examining the sign of the value Cmq.

From step 524 operation proceeds to step 526, in step 526, the value of Amqmq, which is the value of (A−Q−Q), is determined as follows Amqmq=−Q. The sign of the value Amqmq can be used in accordance with the invention to determine whether the upper (Amq) or lower (Q) subinterval of A is longer. In particular, if Amqmq is negative, it indicates that the lower subinterval length Q is larger than the upper subinterval length Amq.

Step 528 uses the values Cmq and Amqmq in conjunction with a logical right shift and XOR operation to determine if the code value being processed is within the longer or shorter subinterval. If the code value being processed is in the shorter subinterval, it is determined to be an MPS value while if it is in the longer subinterval it is determined to be an LPS value. Step 528 determines whether the decoded bit-value is MPS or LPS. By comparison with the known method 400, we see that the decoded bit-value is LPS if Cd+D≧0 (that is, Cmq≧0) and Ad+D<Q (that is, Amqmqmq<0) or if Cd+D<0 (that is, Cmq<0) and Ad+D≧Q (that is, Amqmq≧0). Recall that the leftmost bit-value indicates whether a quantity is positive or negative. Thus the decoded bit-value is LPS if and only if the leftmost bit-value of (Cmq XOR Amqmq) is 1. The value SLR(Cmq XOR Amqmq, N-1) is assigned to the variable IsLps; thus this variable has value 1 if the decoded bit-value is LPS and value 0 otherwise.

Then, in step 530 the variable S (which in step 304 of the main MQ decoding routine was provisionally set to the value MPS prior to the value being supplied as input 510 to routine 500) is updated to the value S XOR IsLps (recall that as a result of step 528, the new value of S equals MPS if IsLps equals zero or equals LPS if IsLps equals one). The updated S value 510' is one of the outputs produced by the method 500.

Then in step 532, the variable cx is updated to the value Nxt(cx,IsLps) (NMPS(cx) if IsLps=0 or NLPS(cx) if IsLps=−1). This cx update operation, Nxt, is implemented as a lookup operation using the look-up table 900 of the present invention. The table 900 includes interleaved NMPS and NLPS values. The look-up table is arranged so that two possible values are associated with each cx value which is used as an index to a table entry. Column 902 shows the cx index value. Column 9094 shows the two possible Nxt values which may be returned for each possible cx value shown in column 902. Elements 9000 through 9092 represent different cx entries in the table 900. The first value, i.e., the NMPS value, included with an entry is selected if the second index value IsLps is zero with the second value corresponding to an entry being selected if IsLps is a 1. For example, if, in step 532, at the time the step is executed, cx=0 and IsLps=0, cx would be updated in step 532 to the value 2 based on the content of the entry 9000 shown in FIG. 9. However, if in step 532, at the time the step is executed, cx=0 and IsLps=1, cx would be updated in step 532 to the value 3 based on the content of the entry 9000 shown in FIG. 9. The updated cx value 512' is one of the outputs of method 500.

Step 532 is the same as, or similar in effect, to the updating of cx in step 416, 418, 424, or 426. Execution then proceeds to step 510.

From step 532 operation proceeds to step 534. In step 534 a variable Cltq is set to the value SAR(Cmq, N-1) (this will result in a value having, in binary representation, all zeroes if C is non-negative and all ones otherwise). A value of Cltq=0 indicates that the coded value fell within the upper subinterval and that the upper subinterval was selected for further processing. Cltq will be all 1's when the lower subinterval was selected.

Next, in step 538 the variable A is computed by subtracting (Amqmq AND Cltq) from Amq. In this operation, if C<0, Cltq will be all 1's (indicating the lower subinterval was chosen), then the subtracted quantity equals Amqmq=(A−Q−Q) and thus the value of A is (A−Q)−(A−Q−Q)=Q which is the length of the lower subinterval. If C≧0 (indicating that the coded value was in the upper subinterval and that the upper subinterval was chosen as indicated by Cltq being all 0's) then the subtracted value (Amqmq AND Cltq) equals 0 and thus when the upper subinterval is selected, in step 538 the value of A is updated to Amq which is the length of the upper subinterval. Thus this operation sets A to the correct new interval length, i.e., the length of the interval in which the coded value C is located, whether it be the upper or lower subinterval.

Next, in step 540 the coded value C is updated. The purpose of step 510 is to reduce C by the length (Q) of the lower subinterval if the upper coding subinterval was chosen. Cltq will be all 0's if the upper subinterval was chosen. This is achieved by setting C=Cmq+(Q AND Cltq). Recall that Cltq will be 0 if the upper subinterval was selected. Accordingly, when the upper subinterval is selected (Q AND Cltq) will be 0 resulting in C being set to Cmq which is equal to (C−Q) where Q as will be recalled is the lower subinterval length.

Operation then proceeds to renormalization step 542. The inputs to this step are the updated values of A and C and the coded data stream 514. This step performs the same or similar function as step 428 of the known method in those cases when step 428 is necessary, i.e., when the updated value of A is less than Amin. Since renormalization step 542 can be implemented using the known MQ decoder renormalization procedures it will not be discussed further.

Execution proceeds from renormalization step 542 to base value updating step 544. In step 544 the value D is updated to A−Amin thereby temporarily updating D to reflect the update of A. Then in step 546 the final updated value of D is determined by setting D to the minimum of A−Amin and C, where, by this point the updated A and C values are being used. D is updated in step 546 by setting D equal to D+((C−D) AND SAR (C−D,N-1)) in accordance with the present invention, thereby updating D without the need for branches. In this update, SAR(C−D, N-1) is a quantity whose binary expression is all ones if C<D, (where D=A−Amin as a result of step 544) or all zeroes if C≧D (where D=A−Amin). Thus, the quantity (C−D) AND SAR(C−D, N-1) equals C−D if C<A−Amin or equals zero if C≧A−Amin. As a result, the new value of D which is (D+(C−D) AND SAR(C−D, N-1)) equals D (which is A−Amin) if C<A−Amin or equals zero if C≧A−Amin. This step is equivalent in effect to the effect of steps 454-456-458 but does not involve the use of a branch in determining the new value of D. The updated D value 504' is output by step 546 and used in step 548 and 550 to update the values of Ad and Cd to reflect the new values of A, C and D determined by method 500.

Step 548 generates the new discounted value Ad by performing the computation Ad=A−D. The resulting updated value Ad 502' is one of the outputs of method 500. Similarly the new value Cd 506' is calculated in step 550. With updated Ad 502' and Cd 506' processing performed by method 500 is completed and processing will return in step 552 to the main MQ decoding routine with the various output values having been updated by the processing performed by method 500.

Figure 6:
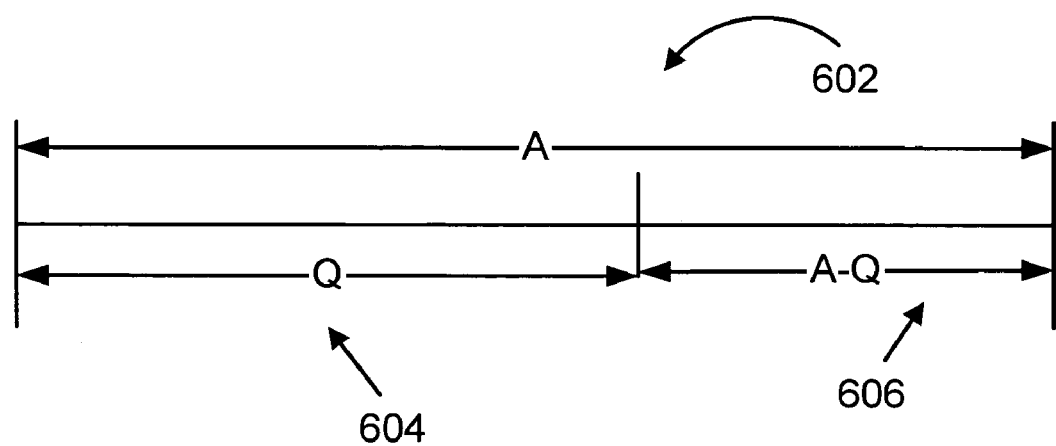
FIG. 6 illustrates an exemplary total interval in which a codeword may occur and the upper and lower sub-intervals included in the total interval.

FIG. 6 illustrates an exemplary coding interval 602 of length A divided into a first, e.g.,"lower", subinterval 604 of length Q and a second, e.g., "upper", subinterval 606 of length (A−Q). In this example the lower subinterval is longer than the upper subinterval and hence the lower subinterval represents MPS while the upper subinterval represents LPS. If the code value C is located in the lower subinterval then the decoded bit-value will be MPS; if C is located in the upper subinterval then the decoded bit-value will be LPS.

FIG. 7 illustrates the contents of an exemplary set of context transition tables as used in the prior art for determining NMPS(cx) in Procedures 200 and 400. The leftmost column 702 shows the input index values to the tables, taking values 0-92. Each row 7000-7092 shows look-up table contents corresponding to a single input index value. The table NMPS 704 gives the new index value in the case that the coded bit-value is MPS. The index value 1 is unused.

FIG. 8 illustrates the contents of an exemplary set of context transition tables as used in the prior art for determining NLPS(cx) in Procedures 200 and 400. The leftmost column 802 shows the input index values to the tables, taking values 0-92. Each row 8000-8092 shows look-up table contents corresponding to a single input index value. The table NLPS 806 gives the new index value in the case that the coded bit-value is LPS. The index value 1 is unused.

FIG. 9 illustrates the contents of an exemplary set of context transition tables for determining Nxt(cx,IsLps) in Procedure 500. As compared with the table NMPS and NLPS in FIG. 8, the contents of the two tables have been interleaved so that the NLPS value for any input index value immediately follows the NMPS value for the same input index value. The leftmost column 902 shows the input index values to the tables, taking values 0-92. Each row 9000-9092 shows look-up table contents corresponding to a single input index value. The table Nxt 1804 gives the new index values in the case that the coded bit-value is MPS or LPS, with the MPS value preceding the LPS. The index value 1 is unused.

Figure 12:
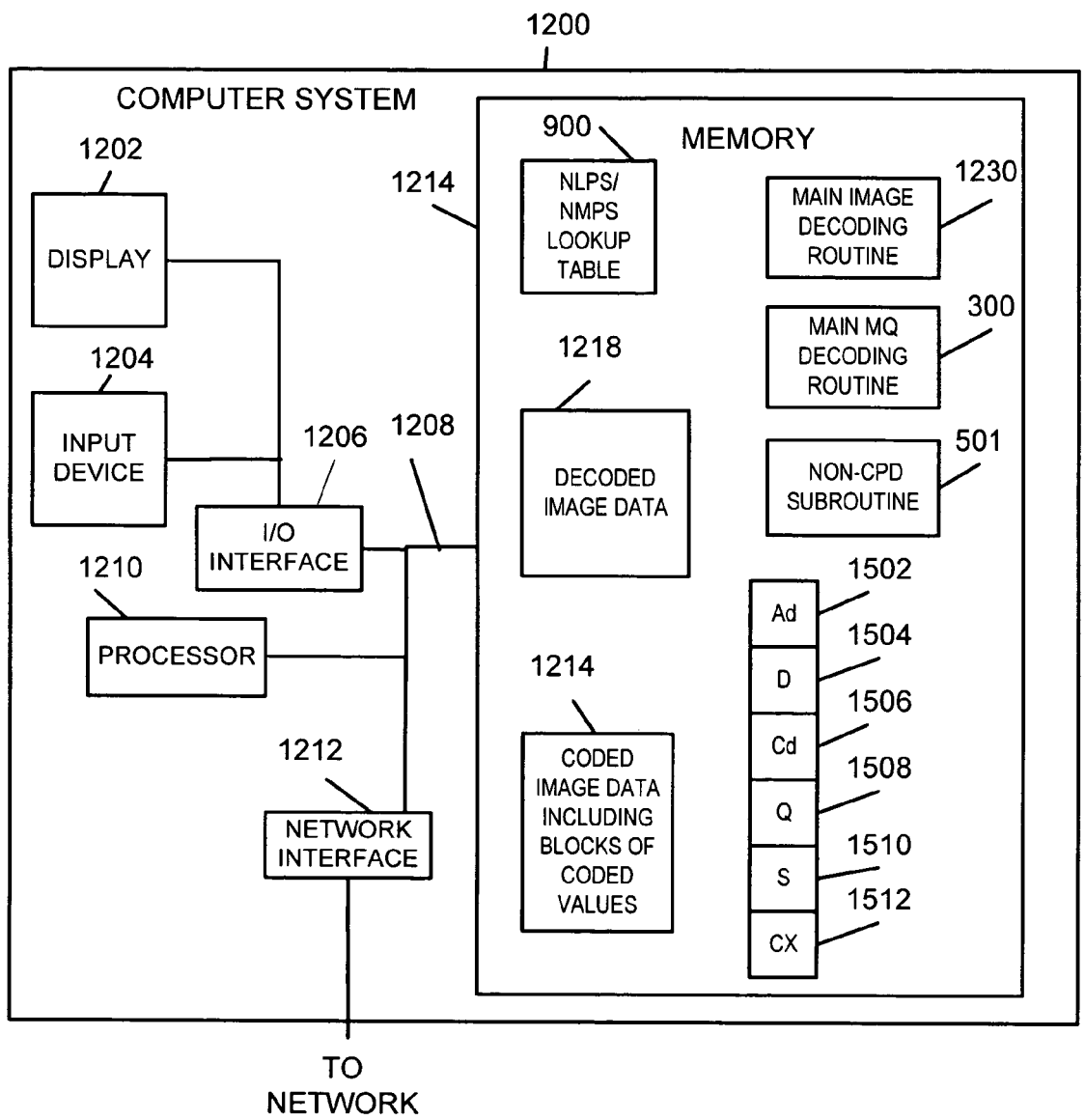
FIG. 12 illustrates a computer system which implements the MQ decoding method shown in FIG. 5 of the present invention.

FIG. 12 illustrates a computer system 1200 which can be used to perform encoding operations in accordance with the present invention. The computer system 1200 includes a display device 1202, input device 1204, I/O interface 1206, processor 1210, network interface 1212 and memory 1214 which are coupled together by bus 1208. The display device 1202 can be used for displaying decoder settings, input data and images generated from resulting decoded image values generated in accordance with the present invention. Input device 1204 can be used for inputting commands, operator selections and/or decoder control information. The I/O interface 1206 interfaces between the input device 1204 and output device 1202 and various other system components such as the processor 1210 and memory 1214 which are coupled to the I/O interface 1206 via bus 1208. The network interface 1212 is coupled to the bus 1208 and to a network 1212 providing a way for the computer system 1200 to receive image data to be decoded and to output decoded blocks of values produced by the decoding methods of the invention. The processor 1210 can be a general purpose processor such as a Pentium processor. The computer system 1200 may be, e.g., a personal computer used to decode encoded JPEG 2000 images.

The memory 1214 includes various sets of data, e.g. encoded image data including blocks of values to be decoded 1514 and decoded image data produced by performing, e.g., JPEG 2000 decoding operations including MQ decoding operations implemented in accordance with the invention. The memory includes an NLPS/NMPS lookup table 900 which may be implemented as a set of interleaved NLPS and NMPS values as shown in FIG. 9. Thus, NLPS and NMPS values may be stored in consecutive memory locations according to a predetermined pattern of the type shown in FIG. 9.

MQ-decoding, in accordance with the present invention, is implemented by the general purposes processor 1210, under control of the main MQ-decoding control routine 300' which calls the non-CPD subroutine 1500 of the present invention. The main MQ-decoding control routine 300' may be implemented using the same steps as performed in the method 300 but with the non-CDP step 310 being implemented using the method 500 of the present invention instead of the known method of FIG. 4. The non-CPD subroutine 1500 includes instructions, which when executed by the processor 1210, cause the processor to implement the steps of method 500 shown in FIG. 5.

Memory 122 includes a set of memory locations 1502, 1504, 1506, 1508, 1510 and 1512 which server to store the input values supplied to, and the output value generated by, non-CPD subroutine 501. Coded image data 1514 includes blocks of coded values which, when read from memory, provide the stream of coded values 514 used by the method 500. For and efficiency standpoint, the values generated by the non-cpd subroutine may be allowed to overwrite the input values stored in memory locations 1502, 1504, 1506, 1508, 1510, 1512. For this reason a single set of memory locations for storing input and output values are shown with the understanding that different memory locations can be provided for input and output values if desired.

The main MQ decoding routine 300', which calls non-CPD subroutine 501 whenever non-CPD decoding is required, is called repeatedly from the main image decoding routine 1230, whenever MQ decoding operations need to be performed as part of a JPEG or other image decoding operation.

In various embodiments, both the input values supplied to, and output values produced by, non-CPD subroutine 501 represent all or portions of images which may be displayed after completion of the decoding of the image data representing the image.

In accordance with the present invention, values are represented in an integer format. However, while stored in integer format the interpretation of the values may depend on the implementation with, in some cases, a value stored in an integer format being sometimes interpreted as a fractional value.

Various features of the present invention are implemented using modules. Such modules may be implemented using software, hardware or a combination of software and hardware. It should also be noted that routines and/or subroutines, or some of the steps performed by such routines, may be implemented in dedicated hardware as opposed to software executed on a general purpose processor. Such embodiments remain within the scope of the present invention. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods. Accordingly, among other things, the present invention is directed to a machine-readable medium including machine executable instructions for causing a machine, e.g., processor and associated hardware, to perform one or more of the steps of the above-described method(s).

Numerous additional variations on the methods and apparatus of the present invention described above will be apparent to those skilled in the art in view of the above description of the invention. Such variations are to be considered within the scope of the invention.

What is claimed:

1. A method of processing encoded image data representing at least a portion of an image, the method comprising the steps of:
    accessing a set of encoded image data stored in a memory;
    operating a processor to perform a JPEG decoding operation on the accessed set of encoded image data, said JPEG decoding operation including performing MQ decoding by processing:
    i) a base value D,
    ii) a subinterval length Q which is a sub-portion of the total coding interval length A;
    iii) a discounted total interval value Ad, said discounted total interval value being equal to a full coding interval A, plus said subinterval length Q, minus said base value D;
    iv) a discounted code value, Cd, said discounted code value being equal to a code value, C, plus said subinterval length Q, minus said base value D; and
    v) a predicted symbol bit value S; said processing including:
        i) computing a first value Amqmq which is equal to (Ad+D−Q);
        ii) computing a second value Cmq which is equal to Cd +D; and
        iii) performing a logical shift right operation by the number of bit positions (N−1) on the value (Cmq XOR Amqmq) where N is the number of bit positions used to represent each of Cmq and Amqmq, to generate a symbol indicator value indicating whether the received predicated symbol bit value S is incorrect, said generated symbol indicator value indicating that said received predicted symbol bit value is incorrect when said generated symbol indicator value assumes the value one;
    generating a set of decoded image data, from a result of the processing performed as part of said MQ decoding, said result including said generated symbol indicator value; and
    supplying decoded image data from said generated set of decoded image data to a display device.

2. The method of claim 1, wherein said processing further includes:
    compute an updated predicted symbol value by performing a logical XOR operation on the received predicted symbol value S and the generated symbol indicator value.

3. The method of claim 2, wherein said processing further includes:
    receive as input: a context state value cx; and
    update said context state value as a function of said received context state value and said generated symbol indicator value.

4. The method of claim 3, further comprising:
    storing in memory a lookup table with interleaved more probable symbol context values and less probable symbol context values, one more probable symbol context value and one less probable symbol context value being stored for each possible context state value cx; and
    wherein updating said context state value includes identifying a table entry corresponding to said received context state and selecting between a more probably context value stored in said table corresponding to said received context state and a less probably symbol context value corresponding to said received context state based on the value of the generated symbol indicator value.

5. The method of claim 4, wherein generating a set of decoded image data includes storing said updated predicted symbol value and said updated context state value in memory.

6. The method of claim 4,
    generate an interval selection indicator value, Cltq, indicating if a coded value equal to Cd+D, is in an upper coding subinterval of length Q, or a lower coding subinterval of length A−Q, said interval selection indicator value Cltq being computed by performing an arithmetic right shift on said value Cmq by N−1 bit positions.

7. The method of claim 6, wherein said processing further includes:
    compute an updated interval length, A, said updated interval length A being computed as: Amq−(Amqmq AND Cltq).

8. The method of claim 7, wherein said processing further includes:
    compute an updated code value C, said updated code value C being computed as Cmq+(Q AND Cltq).

9. The method of claim 8, wherein said processing further includes:
    perform a renormalization operation on said updated interval length A and said updated code value C to update said interval length A to a normalized interval length and to update said code value C to a normalized code value.

10. The method of claim 9, wherein said processing further includes:
    updating said base value D by subtracting a preselected minimum value, Amin, from the normalized interval length A.

11. The method of claim 10, wherein said processing further includes:
generating a new discounted interval value Ad by setting Ad equal to the normalized total interval length A minus the stored updated base value D.

12. The method of claim 11, wherein said processing further includes:
generate a new discounted interval value Cd by setting Cd equal to the normalized code value C minus the stored updated base value D; and
wherein generating a set of decoded image data further includes storing said new discounted interval value Cd in memory.

13. The method of claim 9, wherein said processing further includes:
further updating said base value D by setting D equal to:
D+((C−D) AND SAR(C−D,N−1)), where SAR is a right arithmetic shift operation; and
wherein generating a set of decoded image data further includes storing the updated base value D in memory.

14. The method of claim 1, wherein each of said values D, Q, Cd, A, Q and S are represented in memory in an integer value format.

15. The method of claim 14, wherein said value S is limited to assuming one of two values, a zero value and a 1 value.

16. The method of claim 1, further comprising:
displaying on said display device a portion of an image generated from said decoded image data supplied to said display device.

17. A computer readable medium embodying computer executable instructions for implementing a method of processing encoded image data representing at least a portion of an image, the method comprising the steps of:
accessing a set of stored encoded image data;
performing a JPEG video decoding operation on the accessed set of stored image data, said step of performing a JPEG video decoding operation including:
performing MQ decoding by processing:
  i) a base value D,
  ii) a subinterval length Q which is a sub-portion of the total coding interval length A;
  iii) a discounted total interval value Ad, said discounted total interval value being equal to a full coding interval A, plus said subinterval length Q, minus said base value D;
  iv) a discounted code value, Cd, said discounted code value being equal to a code value, C, plus said subinterval length Q, minus said base value D; and
  v) a predicted symbol bit value S; said processing including:
    i) computing a first value Amqmq which is equal to (Ad+D−Q);
    ii) computing a second value Cmq which is equal to Cd +D; and
    iii) performing a logical shift right operation by the number of bit positions (N+1) on the value (Cmq XOR Amqmq) where N is the number of bit positions used to represent each of Cmq and Amqmq, to generate a symbol indicator value indicating whether the received predicated symbol bit value S is incorrect, said generated symbol indicator value indicating that said received predicted symbol bit value is incorrect when said generated symbol indicator value assumes the value one;
generating a set of decoded image data, from a result of the processing performed as part of said MQ decoder operations, said result including said generated symbol indicator value; and
supplying decoded image data from said generated set of decoded image data to a display device.

18. A system for implementing a method of processing encoded image data representing at least a portion of an image, the system comprising:
means for accessing a set of stored encoded image data;
means for performing a JPEG video decoding operation on the accessed set of stored image data, said step of performing a JPEG video decoding operation including:
means for performing MQ decoding by processing:
  i) a base value D,
  ii) a subinterval length Q which is a sub-portion of the total coding interval length A;
  iii) a discounted total interval value Ad, said discounted total interval value being equal to a full coding interval A, plus said subinterval length Q, minus said base value D;
  iv) a discounted code value, Cd, said discounted code value being equal to a code value, C, plus said subinterval length Q, minus said base value D; and
  v) a predicted symbol bit value S; said processing including:
    i) computing a first value Amqmq which is equal to (Ad+D−Q);
    ii) computing a second value Cmq which is equal to Cd+D; and
    iii) performing a logical shift right operation by the number of bit positions (N−1) on the value (Cmq XOR Amqmq) where N is the number of bit positions used to represent each of Cmq and Amqmq, to generate a symbol indicator value indicating whether the received predicated symbol bit value S is incorrect, said generated symbol indicator value indicating that said received predicted symbol bit value is incorrect when said generated symbol indicator value assumes the value one;
means for generating a set of decoded image data, from a result of the processing performed as part of said MQ decoder operations, said result including said generated symbol indicator value, a set of decoded image data; and
means for supplying decoded image data from said generated set of decoded image data to a display device.

* * * * *